United States Patent
Lin et al.

(10) Patent No.: US 12,310,050 B2
(45) Date of Patent: May 20, 2025

(54) SEMICONDUCTOR STRUCTURE AND METHOD OF FORMING THE SAME

(71) Applicant: Taiwan Semiconductor Manufacturing Co., Ltd., Hsinchu (TW)

(72) Inventors: Kan-Ju Lin, Kaohsiung (TW); Chien Chang, Hsinchu (TW); Chih-Shiun Chou, Hsinchu (TW); TaiMin Chang, Taipei (TW); Hung-Yi Huang, Hsinchu (TW); Chih-Wei Chang, Hsinchu (TW); Ming-Hsing Tsai, Chu-Pei (TW); Lin-Yu Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 655 days.

(21) Appl. No.: 17/484,039

(22) Filed: Sep. 24, 2021

(65) Prior Publication Data
US 2022/0376111 A1    Nov. 24, 2022

Related U.S. Application Data

(60) Provisional application No. 63/190,968, filed on May 20, 2021.

(51) Int. Cl.
*H01L 29/78*   (2006.01)
*H01L 21/768*  (2006.01)
(Continued)

(52) U.S. Cl.
CPC ... *H10D 30/6211* (2025.01); *H01L 21/76874* (2013.01); *H10D 30/024* (2025.01); *H10D 62/151* (2025.01)

(58) Field of Classification Search
CPC ......... H01L 21/76805; H01L 21/76831; H01L 21/76843; H01L 21/76874; H01L 21/76877; H01L 21/76895; H01L 21/76897; H01L 21/823431; H01L 21/823475; H01L 21/823821; H01L 21/845; H01L 23/485; H01L 23/5226; H01L 23/535; H01L 27/0886; H01L 27/0924; H01L 27/1211; H01L 29/0847;
(Continued)

(56) References Cited

U.S. PATENT DOCUMENTS 9,105,490 B2    8/2015   Wang et al.
9,236,267 B2    1/2016   De et al.
(Continued)

FOREIGN PATENT DOCUMENTS

DE    102018102685 A1    6/2019
DE    102020121496 A1    4/2021
(Continued)

*Primary Examiner* — David C Spalla
(74) *Attorney, Agent, or Firm* — Slater Matsil, LLP

(57) ABSTRACT

A semiconductor device includes a gate structure on a semiconductor fin, a dielectric layer on the gate structure, and a gate contact extending through the dielectric layer to the gate structure. The gate contact includes a first conductive material on the gate structure, a top surface of the first conductive material extending between sidewalls of the dielectric layer, and a second conductive material on the top surface of the first conductive material.

20 Claims, 32 Drawing Sheets

(51) Int. Cl.
  *H01L 29/08* (2006.01)
  *H01L 29/66* (2006.01)
  *H10D 30/01* (2025.01)
  *H10D 30/62* (2025.01)
  *H10D 62/13* (2025.01)

(58) Field of Classification Search
  CPC ......... H01L 29/41791; H01L 29/66795; H01L 29/785; H01L 29/7851; H01L 29/7853; H01L 29/7855; H01L 2029/7858
  See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,083,863 B1* | 9/2018 | Hsieh | H01L 21/76886 |
| 2003/0194872 A1* | 10/2003 | Parikh | H01L 21/76868 |
| | | | 257/E21.585 |
| 2004/0022940 A1* | 2/2004 | Nagai | H01L 21/76843 |
| | | | 257/E21.174 |
| 2008/0079154 A1* | 4/2008 | Osaka | C23C 18/1893 |
| | | | 257/751 |
| 2009/0188805 A1 | 7/2009 | Moffat et al. | |
| 2011/0195569 A1 | 8/2011 | Moon et al. | |
| 2017/0213768 A1 | 7/2017 | Steigerwald et al. | |
| 2018/0096934 A1* | 4/2018 | Siew | H01L 29/41791 |
| 2018/0182856 A1* | 6/2018 | Lee | H01L 23/485 |
| 2019/0164817 A1 | 5/2019 | Khaderbad et al. | |
| 2020/0098922 A1 | 3/2020 | You et al. | |
| 2020/0176574 A1 | 6/2020 | Huang et al. | |
| 2020/0219768 A1 | 7/2020 | Parikh et al. | |
| 2021/0118801 A1 | 4/2021 | Wang et al. | |

FOREIGN PATENT DOCUMENTS

| | | |
|---|---|---|
| KR | 20170048324 A | 5/2017 |
| KR | 20180037765 A | 4/2018 |
| KR | 20200050405 A | 5/2020 |
| KR | 20210047221 A | 4/2021 |

* cited by examiner

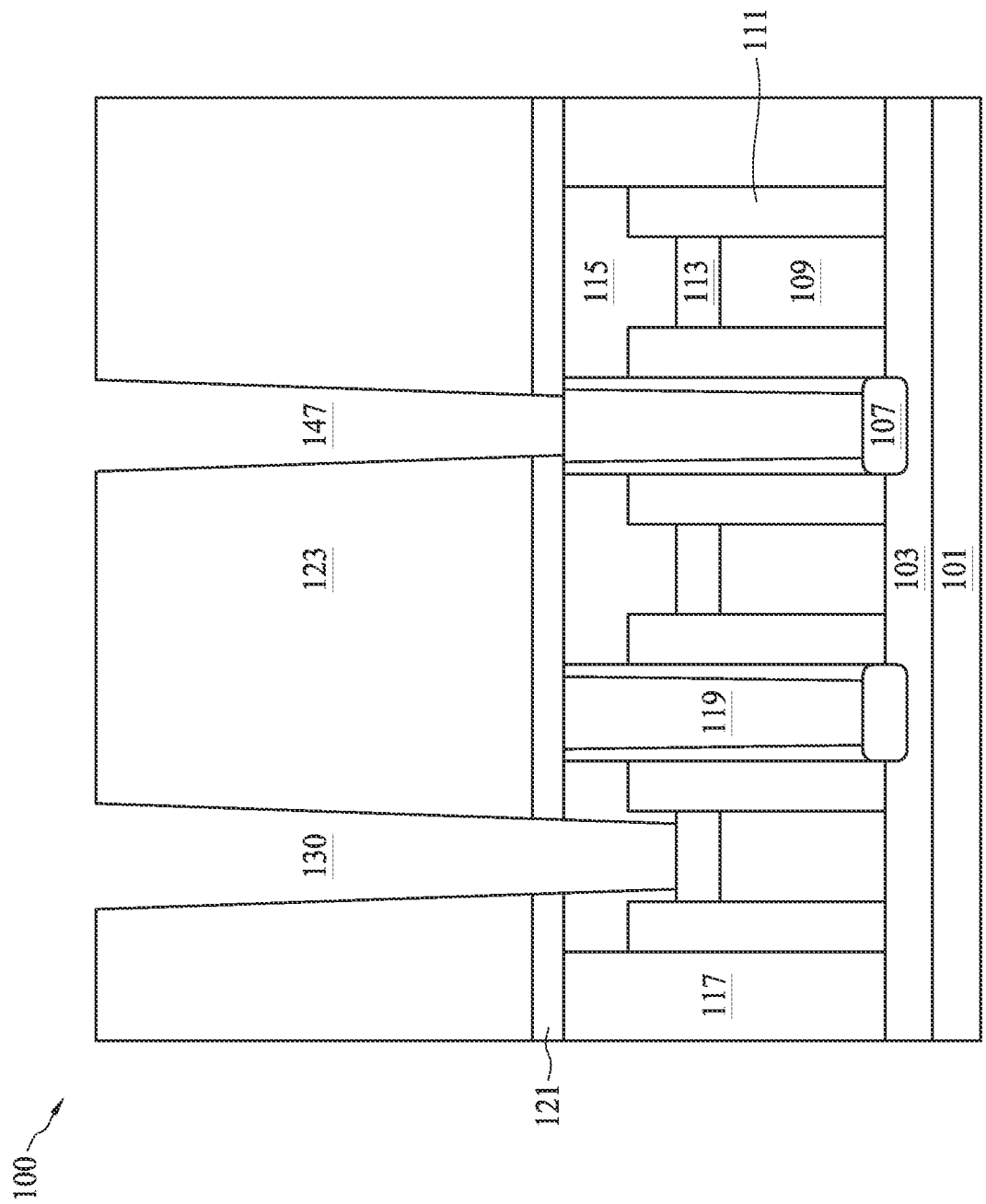

SEMICONDUCTOR STRUCTURE AND METHOD OF FORMING THE SAME

PRIORITY CLAIM AND CROSS-REFERENCE

This application claims the benefit of U.S. Provisional Application No. 63/190,968, filed on May 20, 2021, which application is hereby incorporated herein by reference.

BACKGROUND

The semiconductor industry continues to increase the density of electronic components (e.g., transistors, diodes, resistors, and capacitors) and interconnect features (e.g., contacts, vias, and conductive lines) in integrated circuits (ICs) by innovations in semiconductor technology, such as multiple patterning to reduce the minimum feature-size of lines, spaces, and holes; three-dimensional transistors (e.g., the fin field-effect transistor (FinFET)), and higher number of interconnect levels. Scaling semiconductor devices to smaller dimensions increases the intrinsic speed and packing density of active electronic components. Such advancements made in designing active components may be exploited to achieve higher performance and greater functionality of integrated circuits by concurrently increasing the density of interconnect features by reducing feature-sizes at the interconnect levels while reducing the associated rise in parasitic resistance and capacitance with innovative structures, materials, and processing techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 8A are views of intermediate stages in the manufacture of a semiconductor device, in accordance with some embodiments.

FIGS. 11 through 13A are views of intermediate stages in the manufacture of a semiconductor device, in accordance with some embodiments.

FIGS. 14 through 18A are views of intermediate stages in the manufacture of a semiconductor device, in accordance with some embodiments.

FIGS. 19 through 21A are views of intermediate stages in the manufacture of a semiconductor device, in accordance with some embodiments.

DETAILED DESCRIPTION

Figure 1:
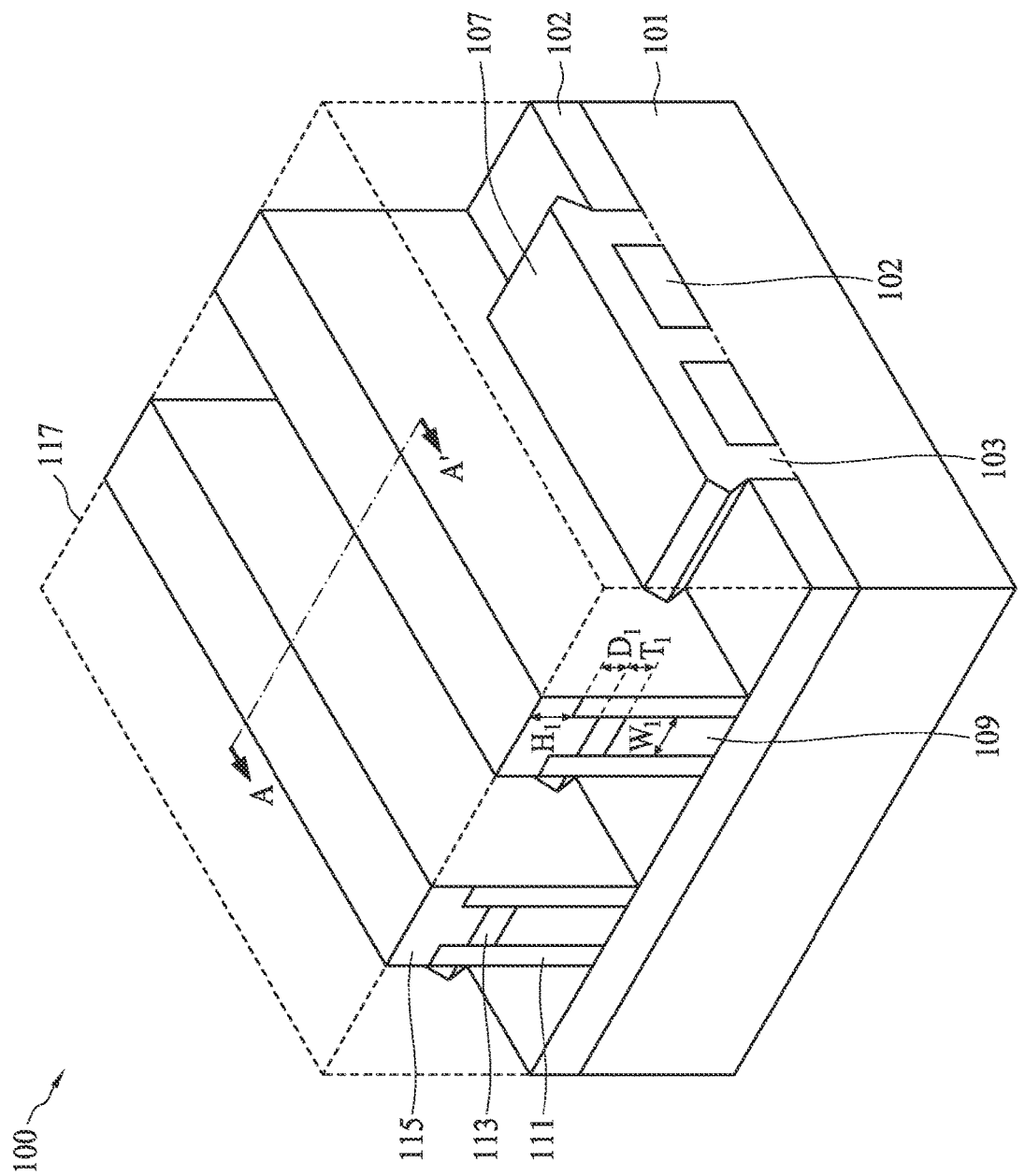
FIG. 1 illustrates a three-dimensional view of a semiconductor device at an intermediate stage of manufacturing, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a first conductive material is selectively formed at the bottom surfaces of openings (e.g., contact openings or via openings) prior to filling the remainder of the openings with a second conductive material. The first conductive material is selectively formed at the bottom surfaces of the openings with a process that allows the first conductive material to be formed in openings of a high aspect ratio. Forming the first conductive material in the openings reduces the aspect ratio of the openings, so that the openings have a low aspect ratio when second conductive material is formed in the openings. This may alleviate the difficulty of gap-filling in the openings and reduce the formation of defects such as voids when filling the openings. When the openings are for conductive contacts, reducing the formation of voids during filling may reduce the contact resistance and improve the performance of the resulting devices. The selective formation process for the first conductive material is a selective process such as selective chemical vapor deposition, selective atomic layer deposition, or electroless plating that selectively forms the first conductive material on conductive bottom surfaces of the openings instead of on dielectric sidewalls of the openings. Due to the selectivity to the conductive bottom surfaces of the openings, the conductive material is formed on the conductive bottom surfaces of the openings and is not formed (or at least is formed at a reduced rate) on the dielectric sidewalls of the openings.

FIG. 1 illustrates a perspective view of a semiconductor device 100 such as a FinFET device, in accordance with some embodiments. The semiconductor device 100 may be a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

In the embodiments in which the device wafer is utilized, the semiconductor device 100 includes a semiconductor substrate 101 (also referred to as a substrate). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the semiconductor substrate 101, e.g., in the front-end-of-line (FEOL) processing of semiconductor manufacturing. In the example of FIG. 1, semiconductor fins 103 (also referred to as fins) are formed protruding above the semiconductor substrate 101. Isolation regions 102, such as shallow-trench isolation (STI) regions, are formed between or around the semiconductor fins 103 using, for example, a deposition process followed by a planarization process and recessing of the deposited material. The semiconductor fins 103 protrude above and from between adjacent isolation regions 102.

After the isolation regions 102 have been formed, a dummy gate dielectric, a dummy gate electrode, and gate spacers 111 may be formed over each of the semiconductor fins 103. In some embodiments, the dummy gate dielectric may be formed by thermal oxidation, chemical vapor deposition, sputtering, or any other methods known and used in the art for forming a gate dielectric. The dummy gate dielectric may comprise a material such as silicon dioxide, silicon oxynitride, and/or a high-k material. However, any suitable material may be used for the dummy gate dielectric. The dummy gate electrode may comprise a conductive material and may be selected from a group comprising of polysilicon, W, Al, Cu, Ti, TiAlN, TaC, TaCN, TaSiN, Mn, Zr, TiN, Ta, TaN, Co, Ni, combinations of these, or the like. The dummy gate electrode may be deposited over the dummy gate dielectric by chemical vapor deposition (CVD), sputter deposition, or other techniques known and used in the art for depositing conductive materials.

Once formed, the dummy gate dielectric and the dummy gate electrode may be patterned to form a series of stacks over the semiconductor fins 103. The stacks define multiple channel regions located on each side of the semiconductor fins 103 beneath the dummy gate dielectric. The stacks may be formed by depositing and patterning a gate mask on the dummy gate electrode using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrode and the dummy gate dielectric may be etched using a dry etching process to form the patterned stacks.

Once the stacks have been patterned, the gate spacers 111 may be formed. The gate spacers 111 may be formed on opposing sides of the stacks. The gate spacers 111 may be formed, for example, by blanket depositing a spacer layer (not separately illustrated in FIG. 1) on the previously formed structure. The spacer layer may comprise silicon nitride, silicon oxide, silicon oxynitride, silicon carbide, silicon oxycarbonitride, silicon oxycarbide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material of the isolation regions 102. In some embodiments, the gate spacers 111 comprise multiple spacer layers, e.g., gate seal spacers and one or more gate spacer layers. The gate spacers 111 may then be patterned, such as by one or more etches, to remove the spacer layer from the horizontal surfaces of the structure, to form the gate spacers 111.

After the formation of the gate spacers 111, portions of the semiconductor fins 103 from those areas not protected by the stacks and the gate spacers 111 are removed. The removal of the semiconductor fins 103 from those areas not protected by the stacks and the gate spacers 111 may be performed by a reactive ion etch (RIE) using the stacks and the gate spacers 111 as masks, or by any other suitable removal process. The removal may be continued until the semiconductor fins 103 are either planar with (as illustrated) or below the surface of the isolation regions 102.

Once these portions of the semiconductor fins 103 have been removed, a mask is placed and patterned to cover the dummy gate electrode to prevent growth and the source/drain regions 107 may be regrown in contact with each of the semiconductor fins 103. In an embodiment the source/drain regions 107 may be regrown and, in some embodiments the source/drain regions 107 may be regrown to form a stressor that will impart a stress to the channel regions of the semiconductor fins 103 located underneath the stacks. In an embodiment wherein the semiconductor fins 103 comprise silicon and the FinFET is a p-type device, the source/drain regions 107 may be regrown through a selective epitaxial process with a material, such as silicon or else a material such as silicon germanium that has a different lattice constant than the channel regions.

Additionally at this point the mask that covered the dummy gate electrode during the formation of the source/drain regions 107 is removed. In an embodiment the hard mask may be removed using, e.g., a wet or dry etching process that is selective to the material of the hard mask. However, any suitable removal process may be utilized.

Next, an inter-layer dielectric (ILD) layer 117 (illustrated in dashed lines in FIG. 1 in order to more clearly illustrate the underlying structures) may be formed over the stacks and the source/drain regions 107. The ILD layer 117 may comprise a material such as silicon oxide, phosphosilicate glass (PSG), borosilicate glass (BSG), boron-doped phosphosilicate glass (BPSG), fluorine-doped silicate glass (FSG), silicon oxide formed using a tetraethyl orthosilicate (TEOS) precursor, silicon nitride, silicon carbide, silicon oxycarbide, silicon oxynitride, silicon carbonitride, silicon oxycarbonitride, lanthanum oxide, aluminum oxide, aluminum oxynitride, yttrium oxide, zirconium silicide, zirconium nitride, zirconium oxide, zirconium aluminum oxide, tantalum oxide, tantalum carbonitride, hafnium oxide, hafnium silicide, titanium oxide, zinc oxide, the like, or a combination thereof. The ILD layer 117 may be formed using spin coating, Flowable Chemical Vapor Deposition (FCVD), Plasma Enhanced Chemical Vapor Deposition (PECVD), Low Pressure Chemical Vapor Deposition (LPCVD), or the like, although any suitable deposition process may be used. Once formed, the ILD layer 117 may be planarized with the gate spacers 111 using, e.g., a planarization process such as a chemical mechanical polishing process, although any suitable process may be utilized.

After the planarization of the ILD layer 117, the material of the dummy gate electrode and the dummy gate dielectric may be removed, forming openings between the gate spacers 111 exposing the channel regions of semiconductor fins 103. In some embodiments the dummy gate electrode and the dummy gate dielectric may be removed using, e.g., wet or dry etching processes that utilizes etchants that are selective to the material of the dummy gate electrode and the dummy gate dielectric. In one embodiment the dummy gate electrode may be removed using a wet etchant such as dilute hydrofluoric acid and hydrogen peroxide. However, any suitable removal process may be utilized.

Next, gate structures 109 are formed over the channel regions of the semiconductor fins 103 in the openings between the gate spacers 111. Each of the gate structures 109 may be, e.g., a metal gate structure that includes a gate electrode, work function layer(s) around the gate electrode, and a gate dielectric layer around the work function layer(s). In some embodiments, the gate dielectric layers comprise one or more dielectric layers, such as one or more layers of silicon oxide, silicon nitride, metal oxide, metal silicate, or the like. The gate electrodes may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode is illustrated in FIG. 1, the gate electrode may comprise any number of liner layers, any number of work function tuning layers, and a fill material. Each feature of the gate structures 109 may be deposited and then planarized, such as by a Chemical Mechanical Polish (CMP), to level the top surfaces of the features of the gate structures 109 with the top surfaces of the gate spacers 111. Once planarized, the materials of the gate structures 109 may then be recessed using, e.g., one or more wet or dry etching processes.

A capping layer 113 may be formed over the gate structure 109. The capping layer 113 can be formed using a selective deposition process that deposits the capping layer 113 on the metallic surfaces of the gate structures 109 but does not significantly deposit on dielectric surfaces. In some embodiments, the capping layer 113 is a layer of tungsten, cobalt, ruthenium, titanium nitride, the like, or a combination thereof. In some embodiments, the capping layer 113 is formed to a thickness $T_1$ in a range of 1 nm to 10 nm.

Further referring to FIG. 1, a mask layer 115, also referred to as a sacrificial layer, is formed over the capping layer 113. The mask layer 115 may be used to cover the capping layer 113 during a subsequent deposition of an etch stop layer (see below, FIG. 3). In some embodiments, the mask layer 115 comprises silicon oxide, silicon nitride, silicon carbide, silicon oxycarbide, silicon oxynitride, silicon carbonitride, silicon oxycarbonitride, lanthanum oxide, aluminum oxide, aluminum oxynitride, yttrium oxide, zirconium silicide, zirconium nitride, zirconium oxide, zirconium aluminum oxide, tantalum oxide, tantalum carbonitride, hafnium oxide, hafnium silicide, titanium oxide, zinc oxide, the like, or a combination thereof. The mask layer 115 may be deposited by any suitable process.

In some embodiments, the mask layer 115 extends below a top surface of the gate spacers 111 to a depth $D_1$ in a range of 1 nm to 50 nm. In some embodiments (not illustrated), a topmost surface of the mask layer 115 is level with or below a topmost surface of the gate spacers 111. In some embodiments, the mask layer 115 extends over the gate spacers 111 to a height $H_1$ in a range of 1 nm to 30 nm. In some embodiments (not illustrated), a bottommost surface of the mask layer 115 is level with or above a topmost surface of the gate spacers 111. In some embodiments, the mask layer 115 has a width Wi measured between opposite sidewalls of the gate spacers 111 in a range of 2 nm to 50 nm.

The disclosed FinFET embodiments may also be applied to nanostructure devices such as nanostructure (e.g., nanosheet, nanowire, gate-all-around, or the like) field effect transistors (nano-FETs). In a nano-FET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the nano-FET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

FIGS. 2 through 8A are views of intermediate stages in the manufacture of the semiconductor device 100, in accordance with some embodiments. FIGS. 2 through 8A are cross-sectional views illustrated along line A-A' in FIG. 1, except three gate structures 109 are show.

Figure 2:
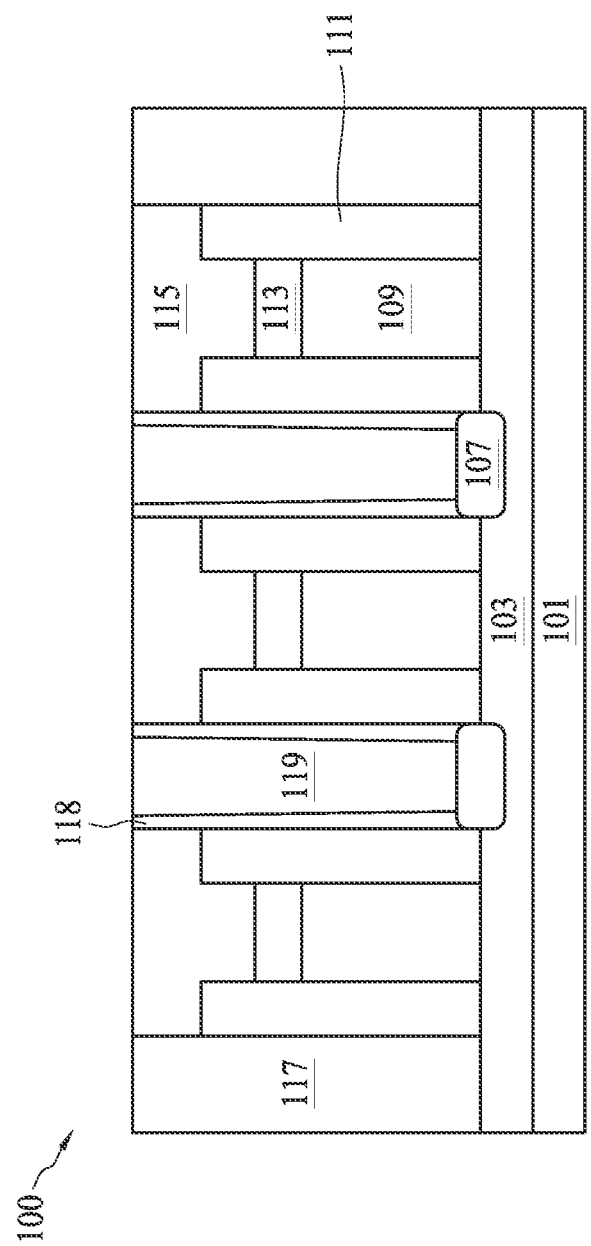

In FIG. 2, contact plugs 119, such as source/drain contacts, are formed in the ILD layer 117. The contact plugs 119 electrically couple the source/drain regions 107 to subsequently formed conductive features such as metal lines, vias, and/or conductive pillars over the source/drain regions 107. In some embodiments, the contact plugs 119 are formed of a conductive material such as cobalt, tungsten, aluminum, copper, molybdenum, ruthenium, titanium, tantalum, titanium nitride, tantalum nitride, the like, or a combination thereof. The formation of the contact plugs 119 may include forming contact openings in the ILD layer 117 to expose the source/drain region 107, forming one or more conductive material(s) in the contact openings, and performing a planarization process, such as a Chemical Mechanical Polish (CMP), to level the top surface of the contact plugs 119 with the top surface of the ILD layer 117. In some embodiments, a contact spacer 118 is formed around the contact plugs 119 in the contact openings. For example, a layer of an acceptable dielectric material may be deposited in the contact openings and anisotropically etched to form the contact spacers 118. The contact plugs 119 may then be formed in the contact openings.

Figure 3:
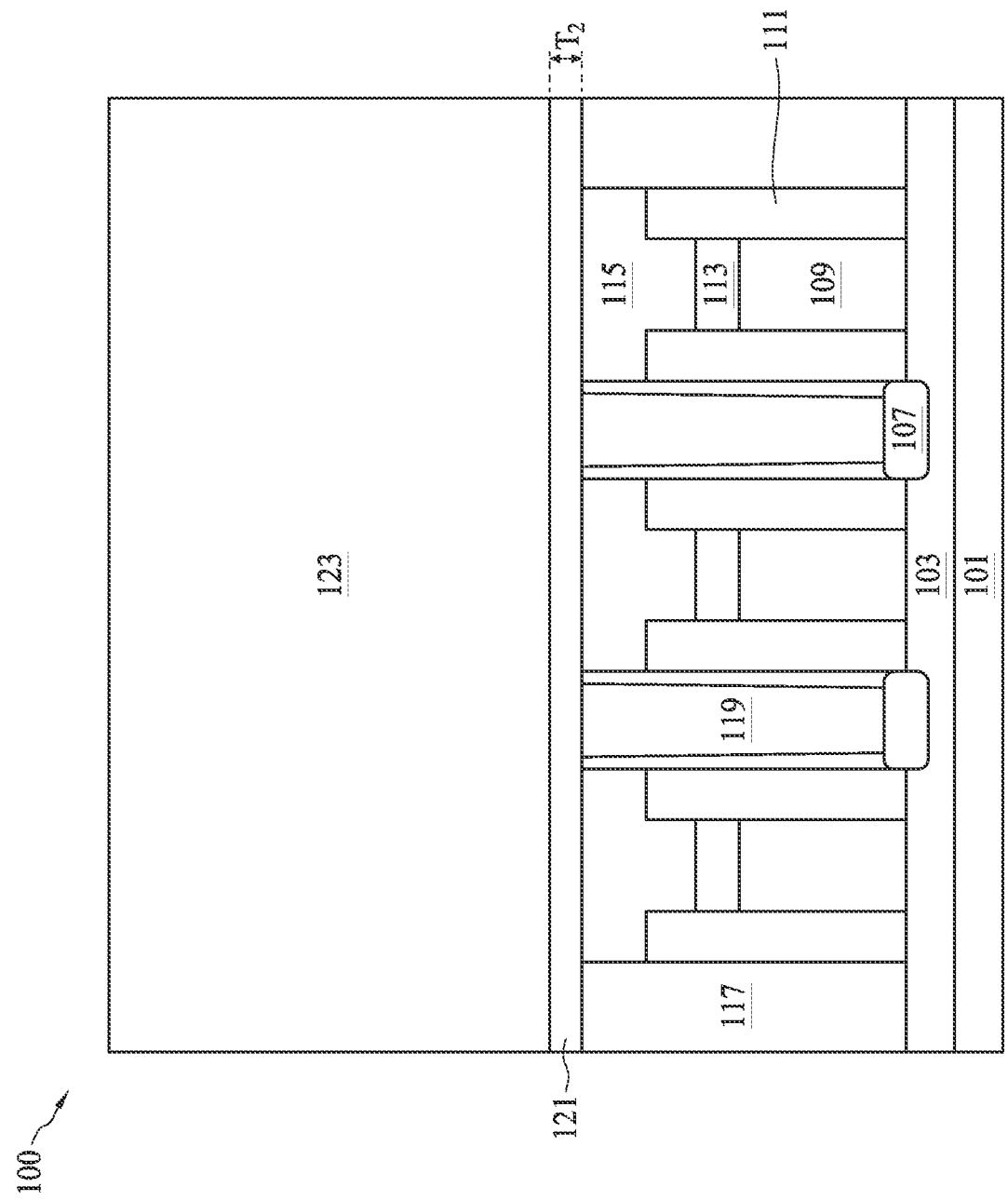

In FIG. 3, an etch stop layer (ESL) 121 and an ILD layer 123 are formed over the ILD layer 117, the contact plugs 119, the gate spacers 111, and the mask layer 115. In some embodiments, the ESL 121, also referred to as a middle contact ESL (MCESL), comprises silicon nitride, silicon oxide, silicon carbide, silicon oxycarbide, silicon oxynitride, silicon carbonitride, silicon oxycarbonitride, lanthanum oxide, aluminum oxide, aluminum oxynitride, yttrium oxide, zirconium silicide, zirconium nitride, zirconium oxide, zirconium aluminum oxide, tantalum oxide, tantalum carbonitride, hafnium oxide, hafnium silicide, titanium oxide, zinc oxide, the like, or a combination thereof. The ESL 121 may be formed by a suitable method such as CVD, PECVD, LPCVD, PVD, atomic layer deposition (ALD), or the like, having a high etching selectivity from the etching of the ILD layer 123. In some embodiments, the ESL 121 is formed to a thickness $T_2$ in a range of 3 nm to 20 nm.

Next, the ILD layer 123 is formed over the ESL 121 and over the ILD layer 117. The ILD layer 123 may be formed of a dielectric material such as silicon oxide, silicon nitride, silicon carbide, silicon oxycarbide, silicon oxynitride, silicon carbonitride, silicon oxycarbonitride, lanthanum oxide, aluminum oxide, aluminum oxynitride, yttrium oxide, zirconium silicide, zirconium nitride, zirconium oxide, zirconium aluminum oxide, tantalum oxide, tantalum carbonitride, hafnium oxide, hafnium silicide, titanium oxide, zinc oxide, the like, or a combination thereof. The formation of the ILD layer 123 may include CVD, PVD, ALD, or the like. However, any suitable materials and methods may be used to form the ILD layer 123.

As will be subsequently described in greater detail, a gate contact 160 (see FIGS. 8A and 8B) to the gate structure 109 will be formed in an opening 130 (see FIG. 4) having a high aspect ratio, and a conductive via 170 (see FIGS. 8A and 8B) to the contact plug 119 will be formed in an opening 147 (see FIG. 6) having a low aspect ratio. The aspect ratio of an opening is the ratio of the height of the opening to the diameter of the opening. Lower portions of the gate contact 160 is formed by depositing a first conductive material in the opening 130 with a selective deposition that helps alleviate the difficulty of gap-filling in openings with a high aspect ratio. The deposition of the first conductive material reduces the effective aspect ratio of the opening 130. The upper portions of the gate contact 160 and the conductive via 170 may then be formed by depositing a second conductive material in the opening 130 and in the opening 147.

Figure 4:
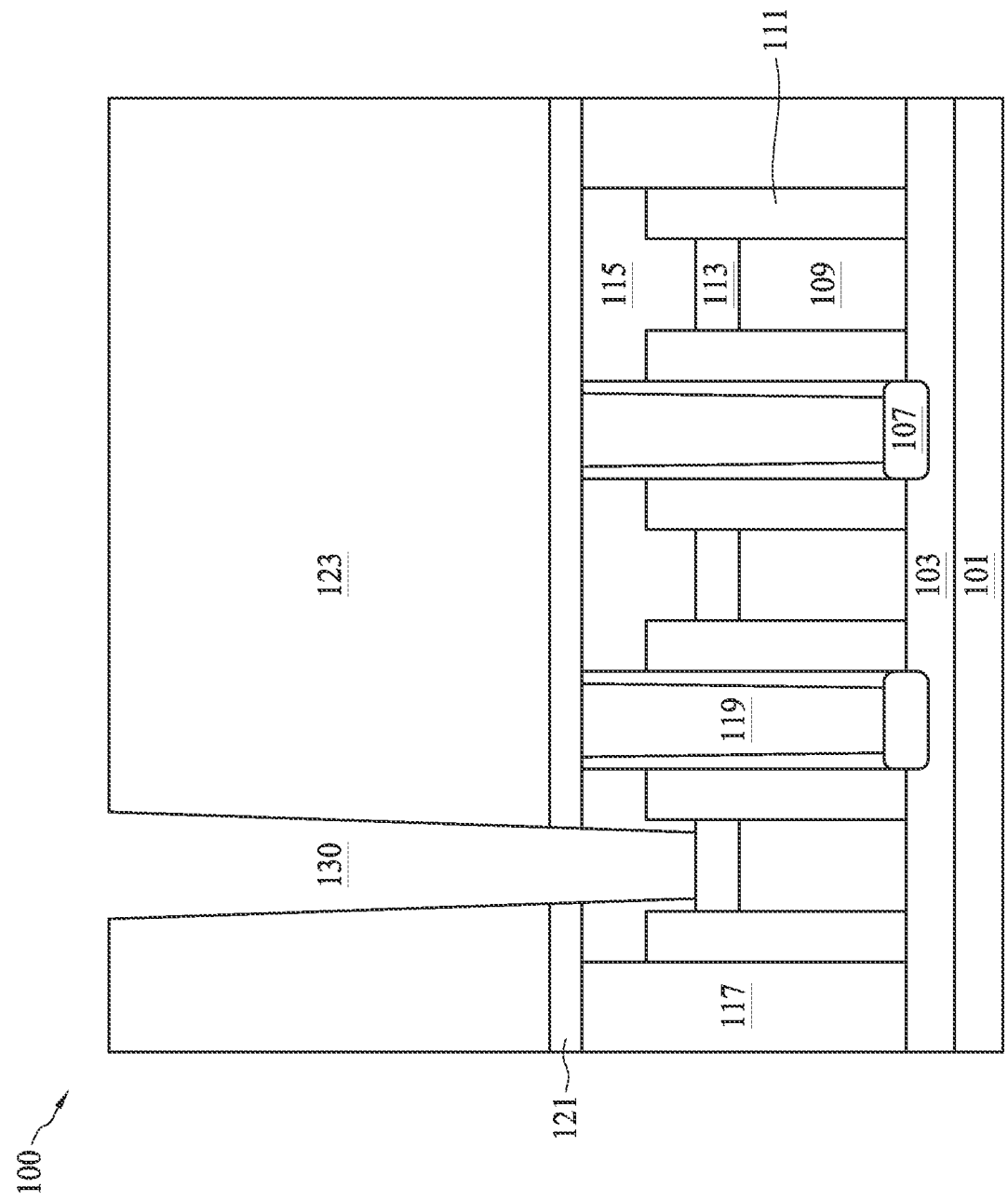

In FIG. 4, an opening 130 is formed through the ILD layer 123, the ESL 121, and the mask layer 115 to expose a top surface of the capping layer 113 over the gate structure 109. As an example of forming the opening 130, a photoresist, such as a single layer photoresist, a tri-layered photoresist, or the like, is formed over the ILD layer 123. The photoresist is patterned by exposing photosensitive material within the photoresist to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photosensitive material such that the physical properties of the exposed portions of the photosensitive material are different from the physical properties of the unexposed portions of the photosensitive material. The photosensitive material may then be developed with a developer to remove the exposed portion of the photosensitive material or the unexposed portion of the photosensitive material, depending on, e.g., whether a negative photosensitive material or a positive photosensitive material is used for the photoresist. Next, the opening in the photosensitive material is extended through the rest of the photoresist, and is transferred to the ILD layer 123, the ESL 121, and the mask layer 115, forming an opening 130. In some embodiments, to transfer the opening in the photosensitive material, one or more anisotropic etching processes, such as one or more anisotropic plasma etching processes, are performed. The one or more anisotropic plasma etching processes may be reactive-ion etching (RIE) processes. After forming the opening 130, the photoresist is removed from the top surface of the ILD layer 123. In some embodiments, an ashing process (e.g., a plasma process) is performed to remove the photoresist. The remaining opening 130 exposes top surfaces of a capping layer 113 over one of the gate structures 109. In some embodiments, multiple openings 130 extending to respective portions of the capping layer 113 over respective gate structures 109 are formed in the same process. The openings 130 have a high aspect ratio, such as an aspect ratio of at least 4, such as an aspect ratio in the range of 5.5 to 8.

Figure 5:
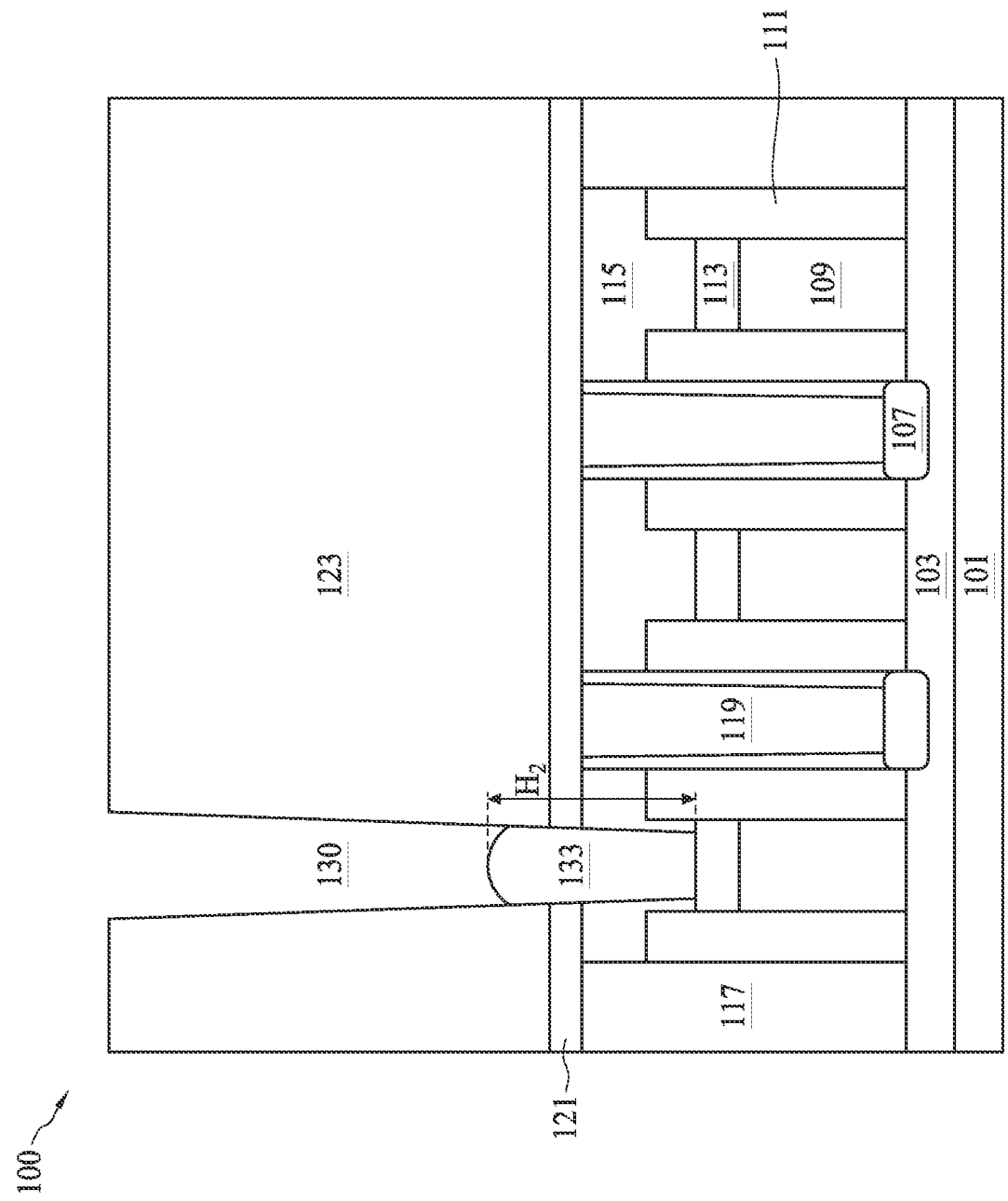

In FIG. 5, a first conductive material 133 is selectively formed on the exposed surface of the capping layer 113 in the opening 130. The first conductive material 133 is thus formed in contact openings having a high aspect ratio. The first conductive material 133 is selectively formed by a process that is useful for alleviating the difficulty of gap-filling in openings with a high aspect ratio. This can reduce the formation of defects such as voids when subsequently filling the remaining portions of the opening 130, which may reduce contact resistance and improve device performance. Selectively forming the first conductive material 133 at the lower portion of the opening 130 reduces the effective aspect ratio of the opening 130 so that a subsequent filling process (see below, FIG. 7) may fill the opening 130 with better gap-filling properties, reducing void formation. The first conductive material 133 is formed using a suitable selective formation process, which selectively forms the first conductive material 133 from the exposed conductive material of the capping layer 113. The selective formation process may be selective CVD, electroless plating, the like, or a combination thereof. Because the first conductive material 133 is formed with a process selective to the conductive material of the capping layer 113, the first conductive material 133 is formed at a faster rate on the capping layer 113 than on exposed insulating material of the ILD layer 123, the ESL 121, and the mask layer 115. The first conductive material 133 is not formed or is formed at a reduced rate on exposed insulating material of the ILD layer 123, the ESL 121, and the mask layer 115. In some embodiments, the first conductive material 133 comprises tungsten, ruthenium, molybdenum, cobalt, copper, the like, or a combination thereof. In some embodiments, the first conductive material 133 is formed of tungsten, molybdenum, ruthenium, the like, or a combination thereof with a selective CVD process. In some embodiments, the first conductive material 133 is formed of cobalt, copper, the like, or a combination thereof with an electroless plating process.

In some embodiments, the first conductive material 133 is formed to a height $H_2$ above an upper surface of the capping layer 113 in a range of 5 nm to 40 nm, which may improve subsequent gap-filling of the opening 130 and reduce void formation. Forming the first conductive material 133 to a height less than 5 nm may not reduce the aspect ratio of the opening 130 enough to improve subsequent gap-filling, leading to increased void formation. Forming the first conductive material 133 to a height greater than 40 nm may lead to defective filling by selectivity loss, which may cause the first conductive material 133 to be formed extending from the sidewalls of the opening 130 and/or over the top of the opening 130, which may block the opening 130 from subsequent filling and leave portions of the opening 130 unfilled.

In some embodiments, a top surface of the first conductive material 133 is below a bottom surface of the ESL 121 by a distance in a range of 0.5 nm to 5 nm. In some embodiments, a top surface of the first conductive material 133 is between the bottom surface of the ESL 121 and a top surface of the ESL 121. In some embodiments, a top surface of the first conductive material 133 is above the top surface of the ESL 121 by a distance in a range of 0.5 nm to 5 nm. In some embodiments, as illustrated in FIG. 5, the first conductive material 133 has a convex top surface, which may be due to the first conductive material 133 being selectively formed on conductive surfaces at a greater rate than on dielectric surfaces, such as the sidewalls of the ILD layer 123, and the top surface of the first conductive material 133 extends between opposite sidewalls of the ILD layer 123. In other embodiments, other surface profiles of the first conductive material 133 may occur (see below, FIGS. 8E-H).

As an example of forming the first conductive material 133, a selective CVD process may be used to form tungsten on an exposed surface of the capping layer 113 in the opening 130. The selective CVD process may be performed by exposing the surface of the capping layer 113 to a tungsten-containing precursor such as $WF_x$ and/or $WCl_x$ gas. In some embodiments, the selective CVD process to form tungsten is performed at a pressure in a range of 0.1 Torr to 50 Torr. In some embodiments, the selective CVD process to form tungsten is performed at a temperature in a range of 200° C. to 450° C. In some embodiments, the selective CVD process to form tungsten also includes performing $H_2$ and/or $NH_3$ treatments. For example, the selective CVD process may further include exposing the surface of the capping layer 113 to a hydrogen-containing precursor such as $H_2$ and/or $NH_3$. The hydrogen-containing precursor is a co-reactant which reacts with the tungsten-containing precursor to reduce the tungsten-containing precursor and form the first conductive material 133 (e.g., tungsten).

As another example of forming the first conductive material 133, a selective CVD process may be used to form molybdenum on an exposed surface of the capping layer 113 in the opening 130. The selective CVD process may be performed by exposing the surface of the capping layer 113 to a molybdenum-containing precursor such as $MoF_x$ and/or $MoCl_x$ gas. In some embodiments, the selective CVD process to form molybdenum is performed at a pressure in a range of 0.1 Torr to 50 Torr. In some embodiments, the selective CVD process to form molybdenum is performed at a temperature in a range of 200° C. to 400° C.

As yet another example of forming the first conductive material 133, a selective CVD process may be used to form ruthenium on an exposed surface of the capping layer 113 in the opening 130. The selective CVD process may be performed by exposing the surface of the capping layer 113 to a ruthenium-containing precursor such as $RuO_x$. In some embodiments, the selective CVD process to form ruthenium is performed at a pressure in a range of 1 milliTorr to 10 Torr. In some embodiments, the selective CVD process to form ruthenium is performed at a temperature in a range of 100° C. to 400° C. In some embodiments, the selective CVD process to form ruthenium also includes performing one or more $H_2$ treatments at a temperature in a range of 150° C. to 450° C. For example, the selective CVD process may further include exposing the surface of the capping layer 113 to a hydrogen-containing precursor such as $H_2$. The hydrogen-containing precursor is a co-reactant which reacts with the ruthenium-containing precursor to reduce the ruthenium-containing precursor and form the first conductive material 133 (e.g., ruthenium). An $H_2$ treatment may also be performed to reduce oxides which may have formed in the first conductive material 133.

As yet another example of forming the first conductive material 133, a selective ALD process may be used to form the first conductive material 133. Some or all of the materials previously described as being deposited by selective CVD may also be deposited by selective ALD, such as by cyclically exposing the surface of the capping layer 113 to the any of the precursors previously described as being suitable for selective CVD. For example, selective ALD may be used to deposit tungsten by cyclically exposing the surface of the capping layer 113 to a tungsten-containing precursor and a hydrogen-containing precursor. Similarly, selective ALD may be used to deposit ruthenium by cyclically exposing the surface of the capping layer 113 to a ruthenium-containing precursor and a hydrogen-containing precursor.

As yet another example of forming the first conductive material 133, an electroless plating process may be used to form cobalt on an exposed surface of the capping layer 113 in the opening 130. The electroless plating process may be performed by submerging the exposed surface of the capping layer 113 into an electro-chemical bath. The plating solution selectively forms cobalt on the capping layer 113 in the opening 130 with an autocatalytic chemical reduction of cobalt cations. In some embodiments, the plating solution comprises $CoCl_x$, $CoS_xO_y$ with or without dimethyl-amine borane (DMAB), $NH_4Cl$, $BO_xH_y$, the like, or a combination thereof. In some embodiments, the plating solution has a pH in a range of 6.0 to 9.0. In some embodiments, the electroless plating process to form cobalt is performed at a temperature in a range of 100° C. to 400° C.

As yet another example of forming the first conductive material 133, an electroless plating process may be used to form copper on an exposed surface of the capping layer 113 in the opening 130. The electroless plating process may be performed by submerging the exposed surface of the capping layer 113 into an electro-chemical bath. The plating solution selectively forms copper on the capping layer 113 in the opening 130 with an autocatalytic chemical reduction of copper cations. In some embodiments, the plating solution comprises CuClx, CuSxOy with or without CoCxHyNz, CHxOy, the like, or a combination thereof. In some embodiments, the plating solution has a pH in a range of 7.0 to 10.0. In some embodiments, the electroless plating process to form copper is performed at a temperature in a range of 30° C. to 100° C.

Figure 6:
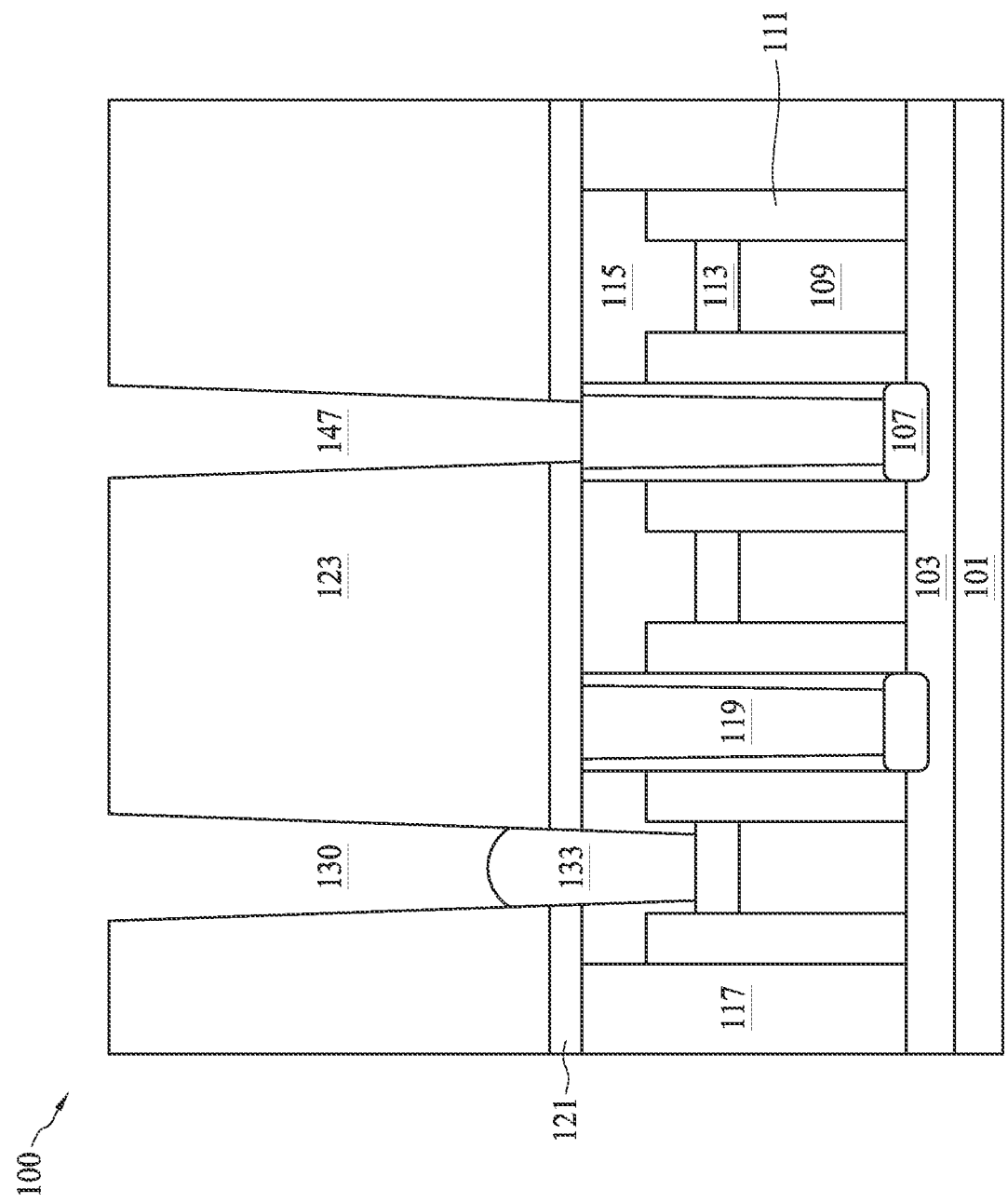

In FIG. 6, an opening 147 is formed through the ILD layer 123 and the ESL 121 to expose a top surface of a contact plug 119. As an example of forming the opening 147, a photoresist, such as a single layer photoresist, a tri-layered photoresist, or the like, is formed over the ILD layer 123 and fills the opening 130 over the first conductive material 133. The photoresist masks the opening 130 and the first conductive material 133 during an etching process to form the opening 147. The photoresist is patterned by exposing photosensitive material within the photoresist to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photosensitive material such that the physical properties of the exposed portions of the photosensitive material are different from the physical properties of the unexposed portions of the photosensitive material. The photosensitive material may then be developed with a developer to remove the exposed portion of the photosensitive material or the unexposed portion of the photosensitive material, depending on, e.g., whether a negative photosensitive material or a positive photosensitive material is used for the photoresist. Next, the opening in the photosensitive material is extended through the rest of the photoresist, and is transferred to the ILD layer 123 and the ESL 121. In some embodiments, to transfer the opening of the photoresist to the ILD layer 123 and the ESL 121, one or more anisotropic etching processes, such as one or more anisotropic plasma etching processes, are performed. The one or more anisotropic plasma etching processes may be reactive-ion etching (RIE) processes. After forming the opening 147, the photoresist is removed from the top surface of the ILD layer 123 and from the opening 130. In some embodiments, an ashing process (e.g., a plasma process) is performed to remove the photoresist. In some embodiments, multiple openings 147, extending to respective contact plugs 119 electrically coupled to respective source/drain regions 107, are formed in the same process. The openings 147 have a low aspect ratio, such as an aspect ratio in a range of 3.5 to 5, such as an aspect ratio of less than 4.

Figure 7:
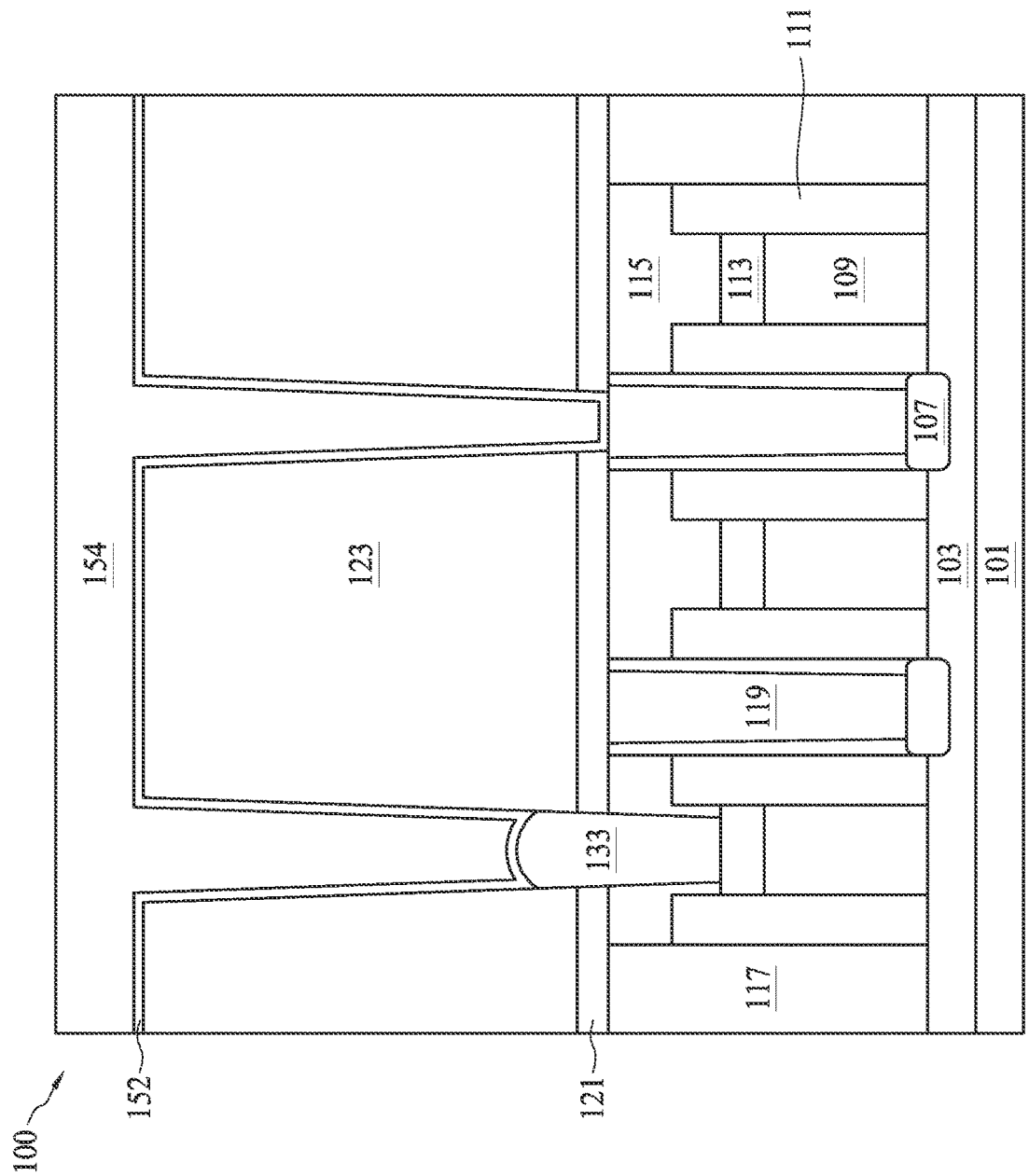

In FIG. 7, the openings 130 and 147 are filled with a second conductive material 154 to form contacts electrically coupled to the gate structures 109 and the source/drain regions 107. In some embodiments, prior to forming the second conductive material 154, a glue layer 152 is formed over bottom surfaces and sidewalls of the openings 130 and 147 and over top surfaces of the ILD layer 123. The glue layer 152 may be formed in order to help adhere the overlying second conductive material 154 with the underlying first conductive material 133 and contact plugs 119. In some embodiments, the glue layer 152 is a conductive material comprising tungsten, ruthenium, titanium, titanium nitride, tantalum nitride, the like, or a combination thereof, and may be formed using CVD, PECVD, ALD, molecular beam epitaxy (MBE), the like, or a combination thereof. In some embodiments, the glue layer 152 is formed to a thickness in a range of 1 Å to 30 Å on sidewalls and bottom surfaces of the openings 130 and 147.

Next, the second conductive material 154 is formed to fill the openings 130 and 147 and may extend over top surfaces of the ILD layer 123. Formations of defects such as voids during the filling of the openings 130 may be reduced by the first conductive material 133 decreasing the aspect ratio of the openings 130, which may decrease contact resistance and improve device performance. In some embodiments, the second conductive material 154 comprises tungsten, ruthenium, aluminum, molybdenum, titanium, titanium nitride, copper, cobalt, the like, or a combination thereof. The second conductive material 154 may be formed by CVD, PVD, electroless plating, the like, or a combination thereof. The second conductive material 154 may be different from the first conductive material 133, and may be formed by a different process than the first conductive material 133. In some embodiments, the first conductive material 133 is formed using electroless plating and the second conductive material 154 is formed using CVD. In some embodiments, the first conductive material 133 is formed using a first CVD process and the second conductive material 154 is formed using a second CVD process, where the first CVD process has greater deposition selectivity between conductive materials (e.g., the capping layer 113) and insulating materials (e.g., of the ILD layer 123, the ESL 121, and the mask layer 115) than the second CVD process (as described above for FIG. 5). In some embodiments, the first conductive material 133 is formed using electroless plating and the second conductive material 154 is also formed using electroless plating.

Figure 8A:
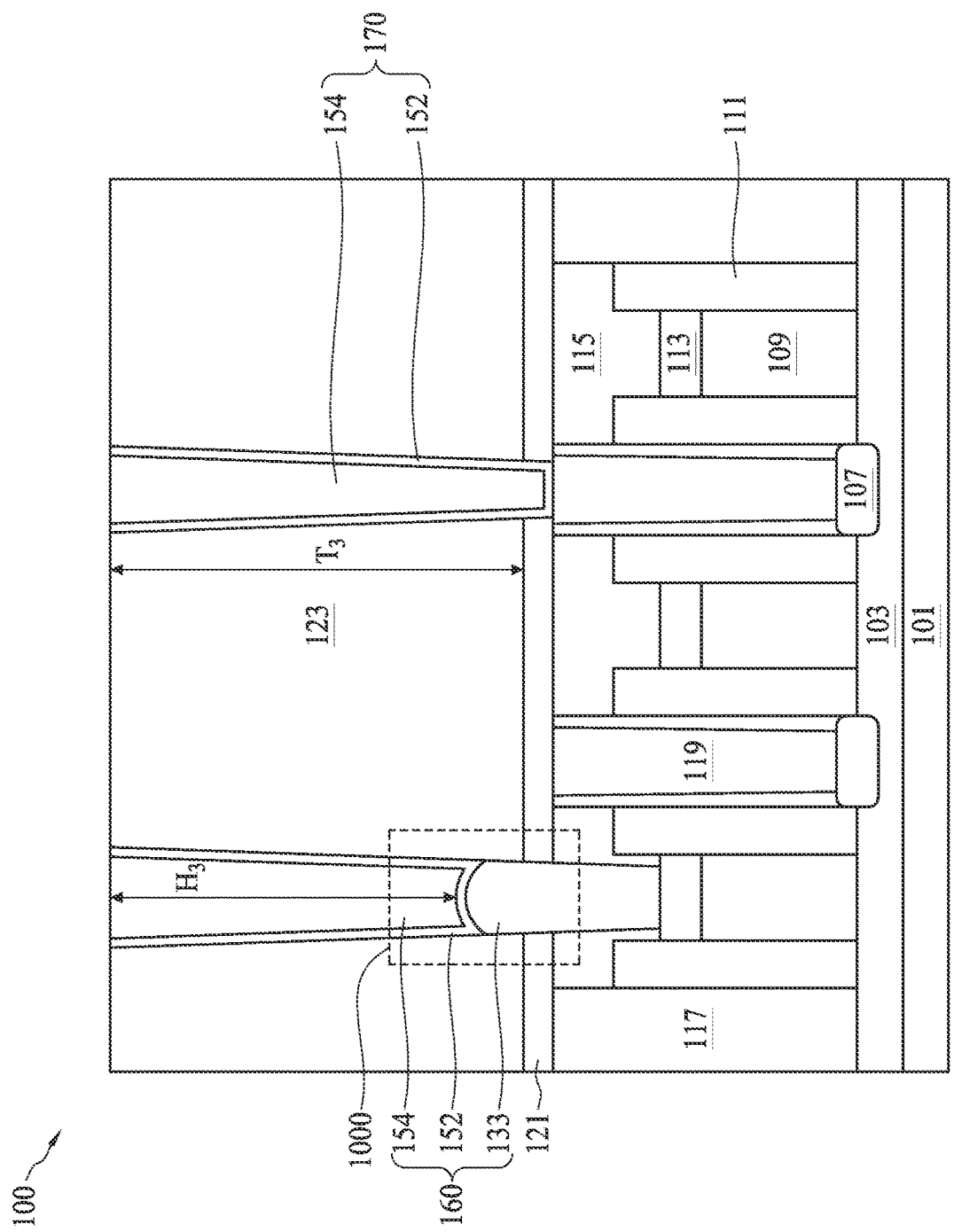

In FIG. 8A, top portions of the glue layer 152, the second conductive material 154, and the ILD layer 123 are removed by a planarization process, such as a CMP. A gate contact 160 is formed from the first conductive material 133 and the remaining portions of the glue layer 152 (if present) and the second conductive material 154 in the opening 130. The first conductive material 133 extends continually from the capping layer 113 to the glue layer 152 (if present) or the second conductive material 154, so that the gate contact 160 is electrically coupled to a gate structure 109. A conductive via 170 is formed from the remaining portions of the glue layer 152 (if present) and the second conductive material 154 in the opening 147. The conductive via 170 extends from a contact plug 119, so that the conductive via 170 is electrically coupled to a source/drain region 107. In some embodiments, after the planarization, a height $H_3$ of the second conductive material 154 in the gate contact 160 is in a range of 5 nm to 40 nm. In some embodiments, after the planarization, a thickness $T_3$ of the ILD layer 123 is in a range of 3 nm to 40 nm.

Figure 8B:
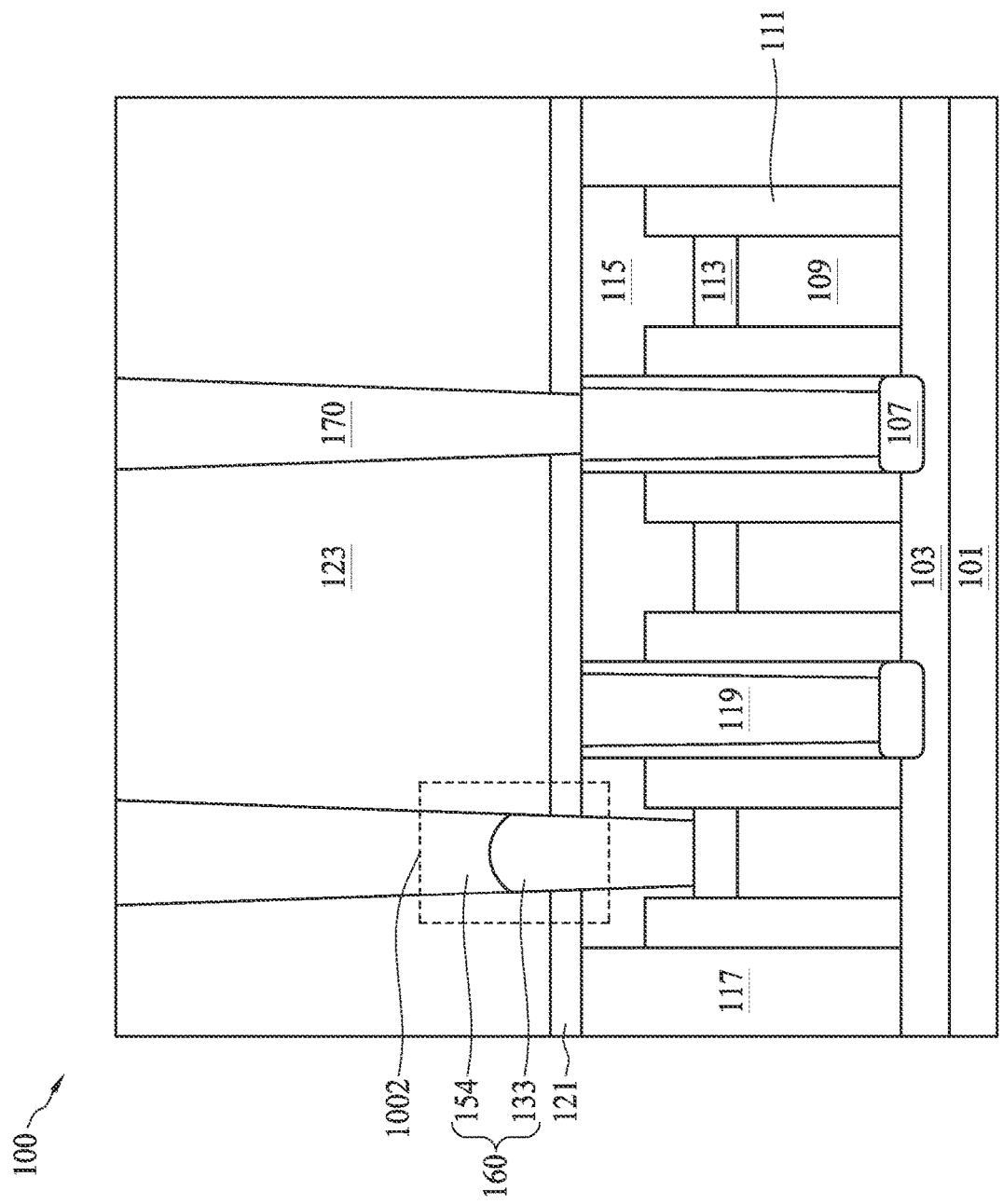
FIGS. 8B, 8C, 8D, 8E, 8F, 8G, and 8H are views of semiconductor devices, in accordance with some embodiments.

In another embodiment, the glue layer 152 is omitted and the second conductive material 154 is formed directly on the first conductive material 133 and on the contact plug 119, as illustrated in FIG. 8B. In this embodiment, the gate contact 160 comprises the second conductive material 154 formed directly on the first conductive material 133, and the conductive via 170 comprises the second conductive material 154 formed directly on the contact plug 119. The structure illustrated in FIG. 8B may be formed using similar materials and methods as described with respect to FIG. 8A, with the omission of forming the glue layer 152 (see above, FIG. 7).

Figure 8D:
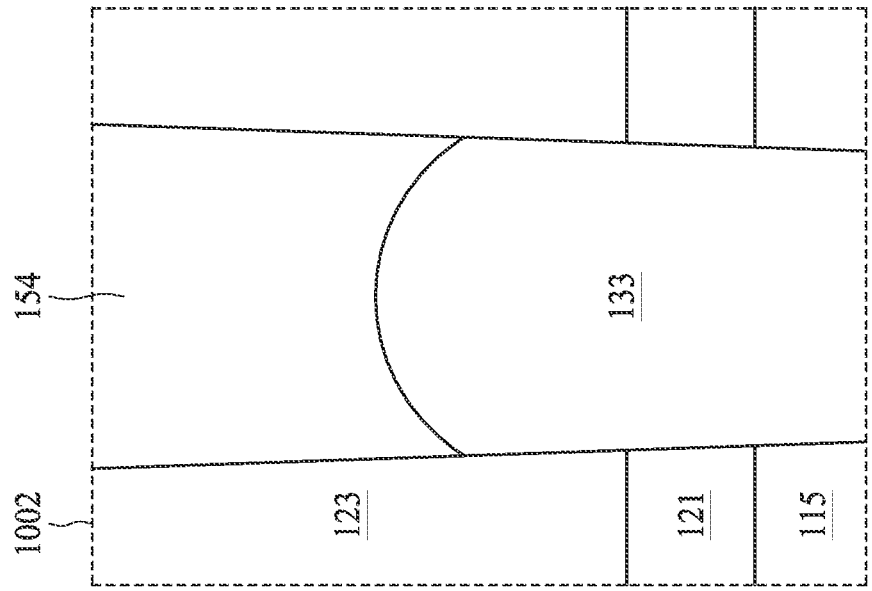
Figure 8C:
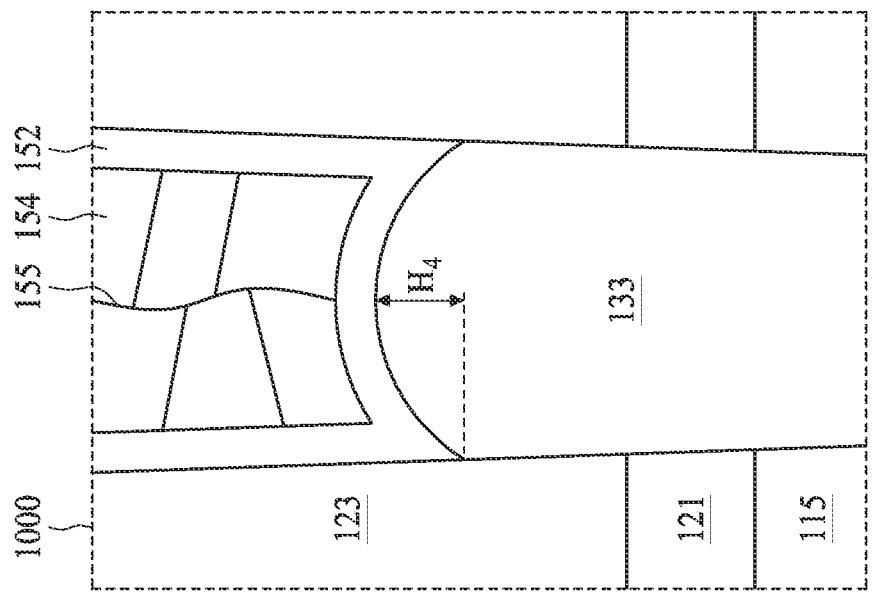

FIG. 8C illustrates a detailed view of region 1000 shown in FIG. 8A, and FIG. 8D illustrates a detailed view of region 1002 shown in FIG. 8B, in accordance with some embodiments. In FIG. 8C, the glue layer 152 is between the first conductive material 133 and the second conductive material 154, and in FIG. 8D, the second conductive material 154 is directly on the first conductive material 133. In some embodiments, the top surface of the first conductive material 133 has a height $H_4$ in a range of 0.5 nm to 10 nm measured from a highest point of the first conductive material 133 to a plane level with a bottom vertex of the top surface of the first conductive material 133, as shown in FIG. 8C. In some embodiments, omitting the glue layer 152 allows the metal grain sizes of the second conductive material 154 to be larger in region 1002 than the metal grain sizes of the second conductive material 154 in region 1000. This is illustrated by metal grain dividers 155 in FIG. 8C being not drawn in FIG. 8D, due to the larger metal grain sizes of the second conductive material 154 in FIG. 8D. The metal grain sizes of the second conductive material 154 may be smaller in region 1000 than in region 1002 due to the glue layer 152. Smaller sizes of the metal grains of the second conductive material 154 can be formed on the material of the glue layer 152 in region 1000. The metal grain sizes of the second conductive material 154 being larger in region 1002 may be advantageous for higher conductance due to a reduction of grain size scattering. The grain sizes of the second conductive material 154 may be similar for different process examples of forming the second conductive material 154, e.g. CVD, PVD, or electroless plating.

Figure 8F:
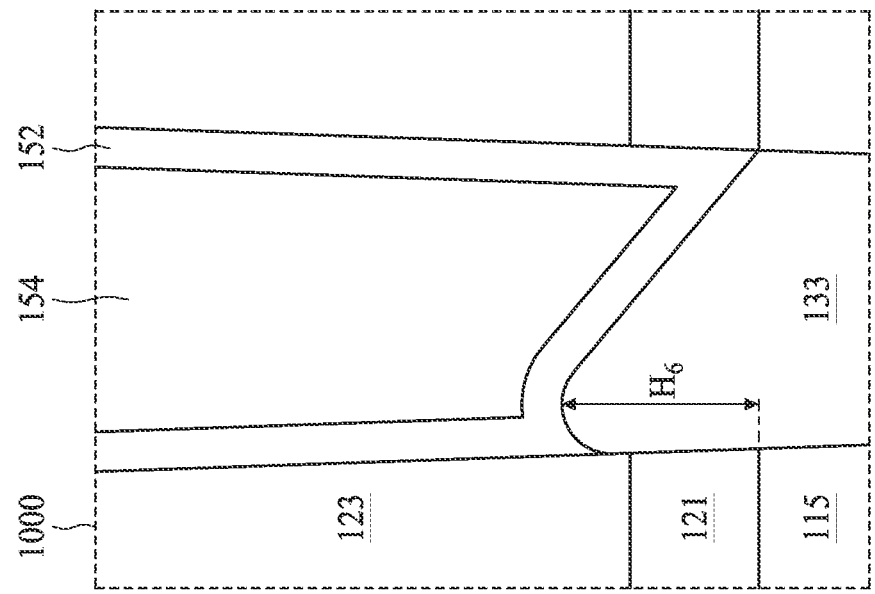
Figure 8E:
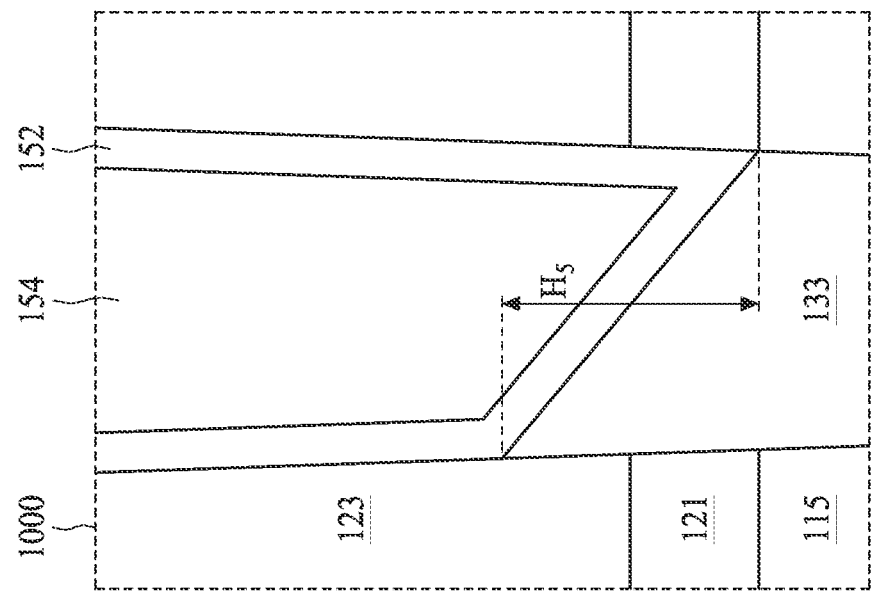
Figure 8H:
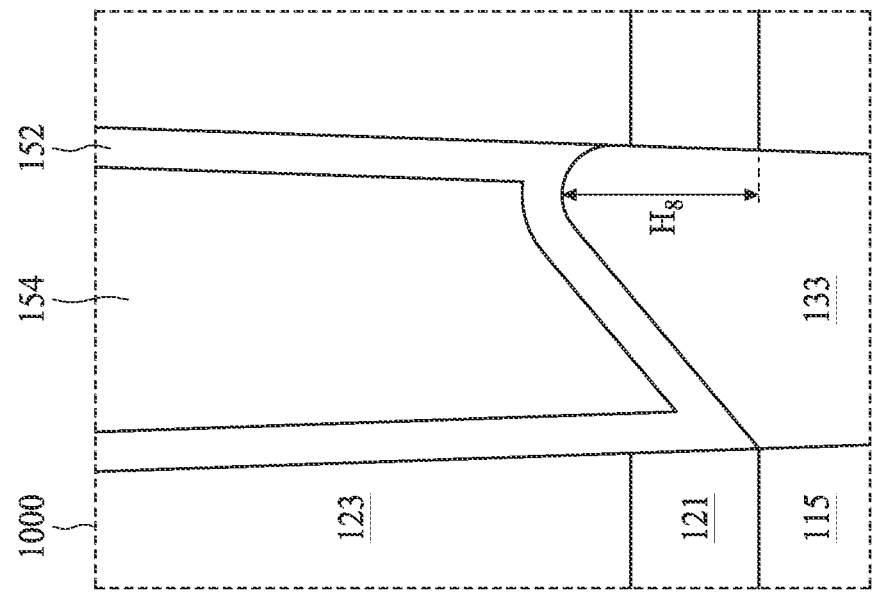
Figure 8G:
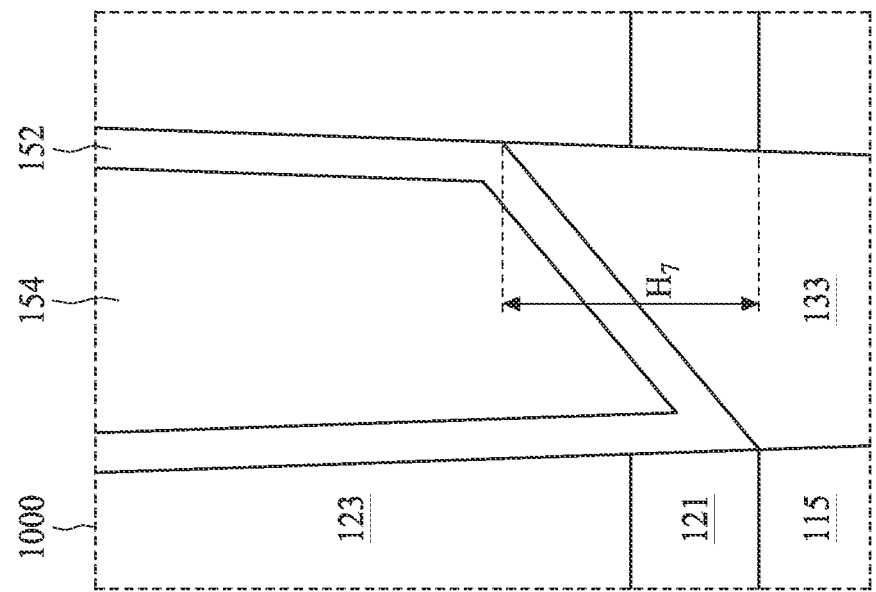

FIGS. 8E, 8F, 8G, and 8H illustrate additional detailed views of region 1000 shown in FIG. 8A, in accordance with some embodiments. Several possible shapes for the first conductive material 133, the glue layer 152, and/or the second conductive material 154 are illustrated in FIGS. 8E-H. For example, FIG. 8E illustrates the top surface of the first conductive material 133 being straight and diagonally sloped from a bottom left corner above a top surface of the ESL 121 to a bottom right corner below the top surface of the ESL 121, which may be caused by different facets of the grain orientation during metal growth due to local roughness of the metal surface. In some embodiments, the top surface of the first conductive material 133 has a height $H_5$ in a range of 0.5 nm to 5 nm measured from a highest point of the first conductive material 133 to a plane level with a bottom vertex of the top surface of the first conductive material 133, as shown in FIG. 8E. FIG. 8F illustrates the top surface of the first conductive material 133 being rounded on a left side and diagonally sloping from the rounded top above a top surface of the ESL 121 to a bottom right corner below the top surface of the ESL 121, which may be caused by different facets of the grain orientation during metal growth due to local roughness of the metal surface. In some embodiments, the top surface of the first conductive material 133 has a height $H_6$ in a range of 0.5 nm to 5 nm measured from a highest point of the first conductive material 133 to a plane level with a bottom vertex of the top surface of the first conductive material 133, as shown in FIG. 8F. FIG. 8G illustrates the top surface of the first conductive material 133 being straight and diagonally sloped from a bottom right corner above a top surface of the ESL 121 to a bottom left corner below the top surface of the ESL 121, which may be caused by different facets of the grain orientation during metal growth due to local roughness of the metal surface. In some embodiments, the top surface of the first conductive material 133 has a height $H_7$ in a range of 0.5 nm to 5 nm measured from a highest point of the first conductive material 133 to a plane level with a bottom vertex of the top surface of the first conductive material 133, as shown in FIG. 8G. FIG. 8H illustrates the top surface of the first conductive material 133 being rounded on a right side and diagonally sloping from the rounded top above a top surface of the ESL 121 to a bottom left corner below the top surface of the ESL 121, which may be caused by different facets of the grain orientation during metal growth due to local roughness of the metal surface. In some embodiments, the top surface of the first conductive material 133 has a height $H_8$ in a range of 0.5 nm to 5 nm measured from a highest point of the first conductive material 133 to a plane level with a bottom vertex of the top surface of the first conductive material 133, as shown in FIG. 8H. Although a certain configuration of the top surface of the first conductive material 133 relative to the top surface of the ESL 121 is shown in FIGS. 8E, 8F, 8G, and 8H, other embodiments may have other configurations. As noted above, the top surface of the first conductive material 133 may be lower or higher than the top surface of the ESL 121.

Figure 9:
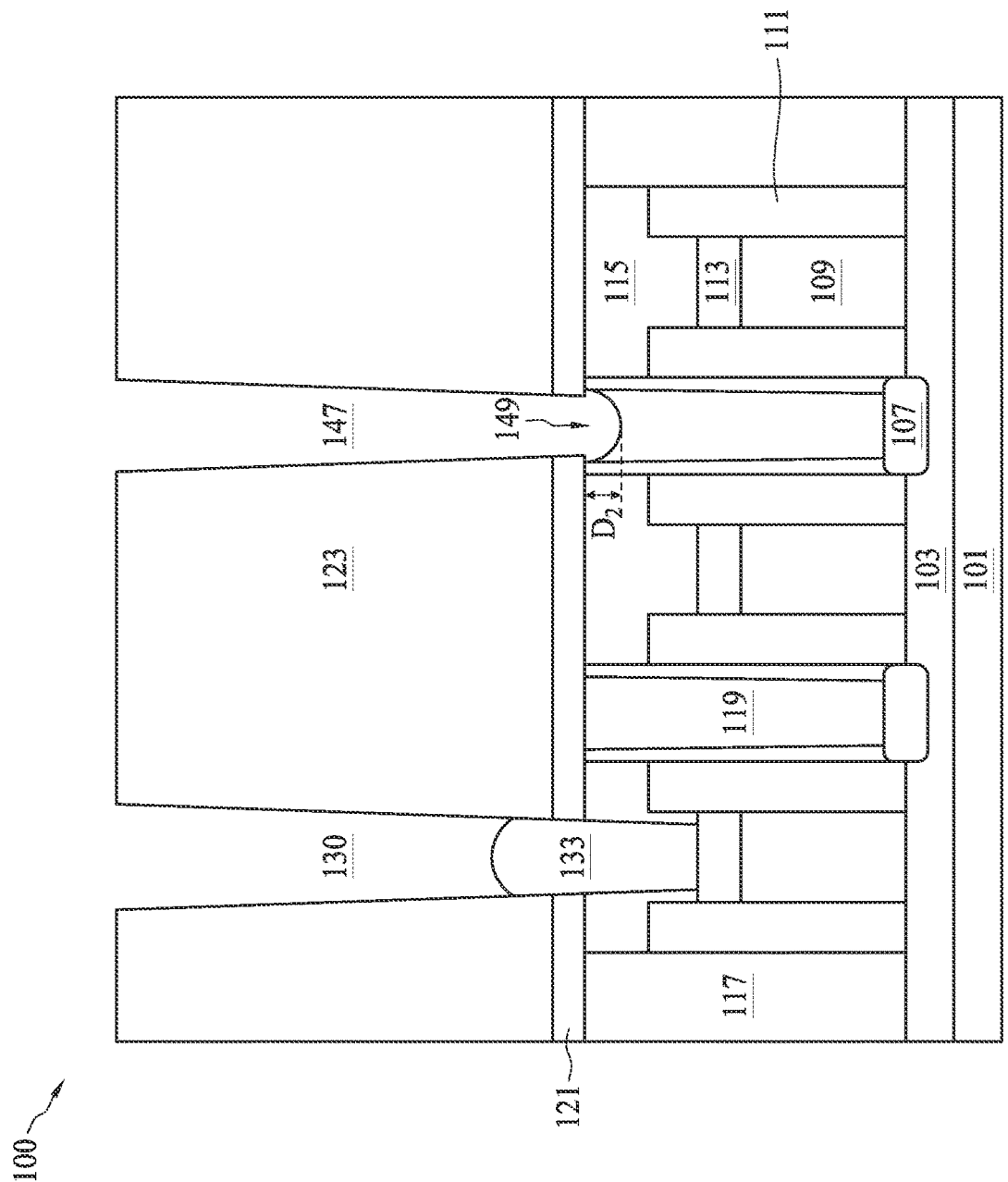
FIGS. 9 through 10 are views of intermediate stages in the manufacture of a semiconductor device, in accordance with some embodiments.
Figure 10:
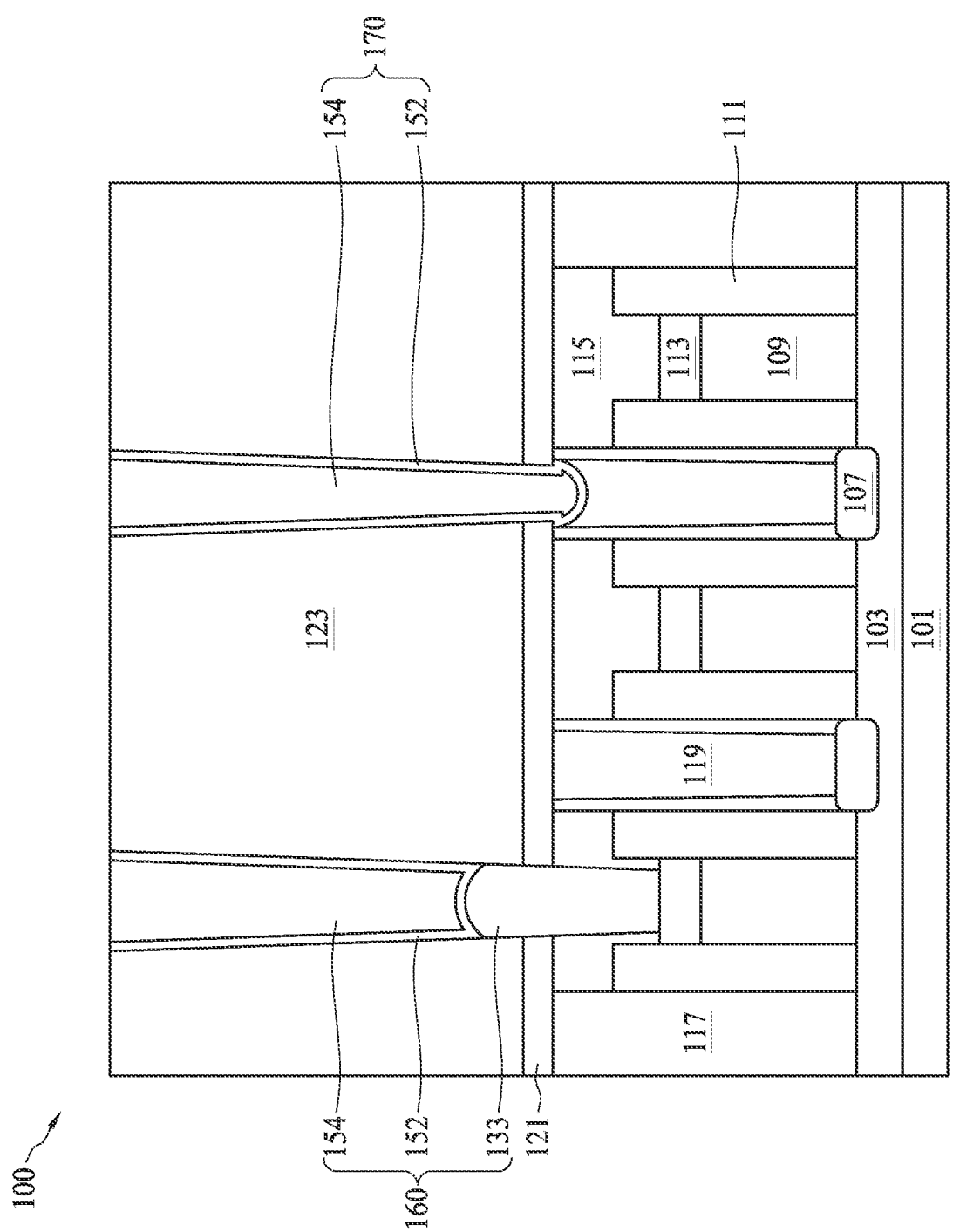

FIGS. 9 through 10 are views of intermediate stages in the manufacture of a semiconductor device 100, in accordance with some embodiments. FIGS. 9 through 10 are cross-sectional views illustrated along line A-A' in FIG. 1, except three gate structures 109 are shown. The process of FIGS. 9 through 10 follows from the step of FIG. 6 (described above).

In FIG. 9, a recess 149 is formed in the top surface of the contact plug 119. In some embodiments, the recess 149 has a concave bottom surface and extends under portions of the ESL 121. In some embodiments, the recess 149 extends to a depth D2 below a bottom surface of the ESL 121 in a range of 0.5 nm to 3 nm.

As an example of forming the recess 149, the etching of the opening 147 may form a residual region (not illustrated) on a top surface of the contact plug 119 by a reaction of the top surface of the contact plug 119 with etchants used to form the opening 147. In some embodiments, the etchants may comprise fluorine and the material of the residual region may comprise a water-soluble metal fluoride such as cobalt fluoride. After the opening 147 is formed, a wet etch such as a wet cleaning process may be performed to remove the residual region from the contact plug 119. In some embodiments, the wet cleaning process includes immersing the semiconductor substrate 101 in deionized (DI) water or another suitable chemical (which may be diluted in DI water). In some embodiments, the wet cleaning process uses ammonium hydroxide. In some embodiments wherein the contact plug 119 is formed of cobalt containing materials, DI water may efficiently dissolve the residual material which may be a water-soluble metal fluoride such as cobalt fluoride, thus removing the material of the residual region and forming the recess 149. In some embodiments, a chemical etchant which reacts with the material of the contact plug 119 may be utilized.

In FIG. 10, the gate contact 160 and the conductive via 170 are formed in the openings 130 and 147, respectively, and the conductive via 170 is further formed in the recess 149. The gate contact 160 and the conductive via 170 may be formed using similar methods and materials as described above with respect to FIGS. 7-8A. The recess 149 is filled by a lower portion of the conductive via 170, forming a rivet-shaped bottom portion of the conductive via 170. The rivet-shaped bottom portion of the conductive via 170 may be useful for anchoring and engaging in the contact plug 119 with better adhesion and clinch, as well as for catching slurry used in subsequent CMP processes (may also be referred to as CMP slurry), such as the CMP process used to planarize top surfaces of the ILD layer 123, the gate contact 160, and the conductive via 170 (see above, FIG. 8A). Thus, the amount of CMP slurry reaching the contact plug 119 may be reduced. This may reduce further etching of the contact plug 119 and decrease contact resistance, improving device performance. Although FIG. 10 illustrates a glue layer 152, in some embodiments, the glue layer 152 is omitted such that the second conductive material 154 is formed directly on the first conductive material 133 and the contact plug 119.

FIGS. 11 through 13A are views of intermediate stages in the manufacture of a semiconductor device 100, in accordance with some embodiments. FIGS. 11 through 13A are cross-sectional views illustrated along line A-A' in FIG. 1, except three gate structures 109 are shown. The process of FIGS. 11 through 13A follows from the step of FIG. 6 (described above).

Figure 11:
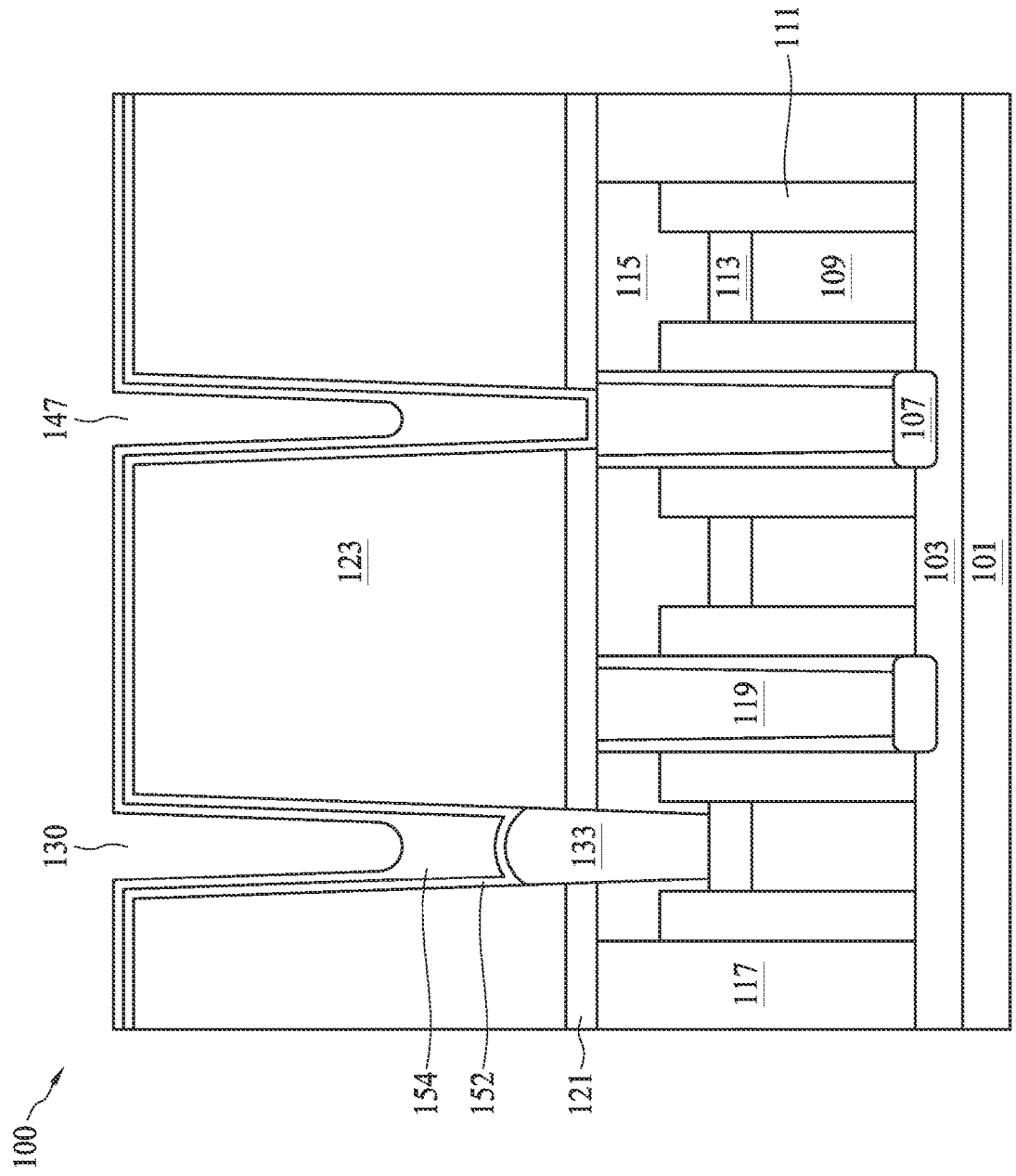

In FIG. 11, the second conductive material 154 is formed so that it does not completely fill the openings 130 and 147. In this embodiment, the aspect ratio of the openings 130 and 147 is still large (such as greater than 3.5) after the first conductive material 133 is formed, and so it may be advantageous to fill the openings 130 and 147 with more than one conductive material in order to fill the openings 130 and 147 with reduced formation of voids.

Figure 12:
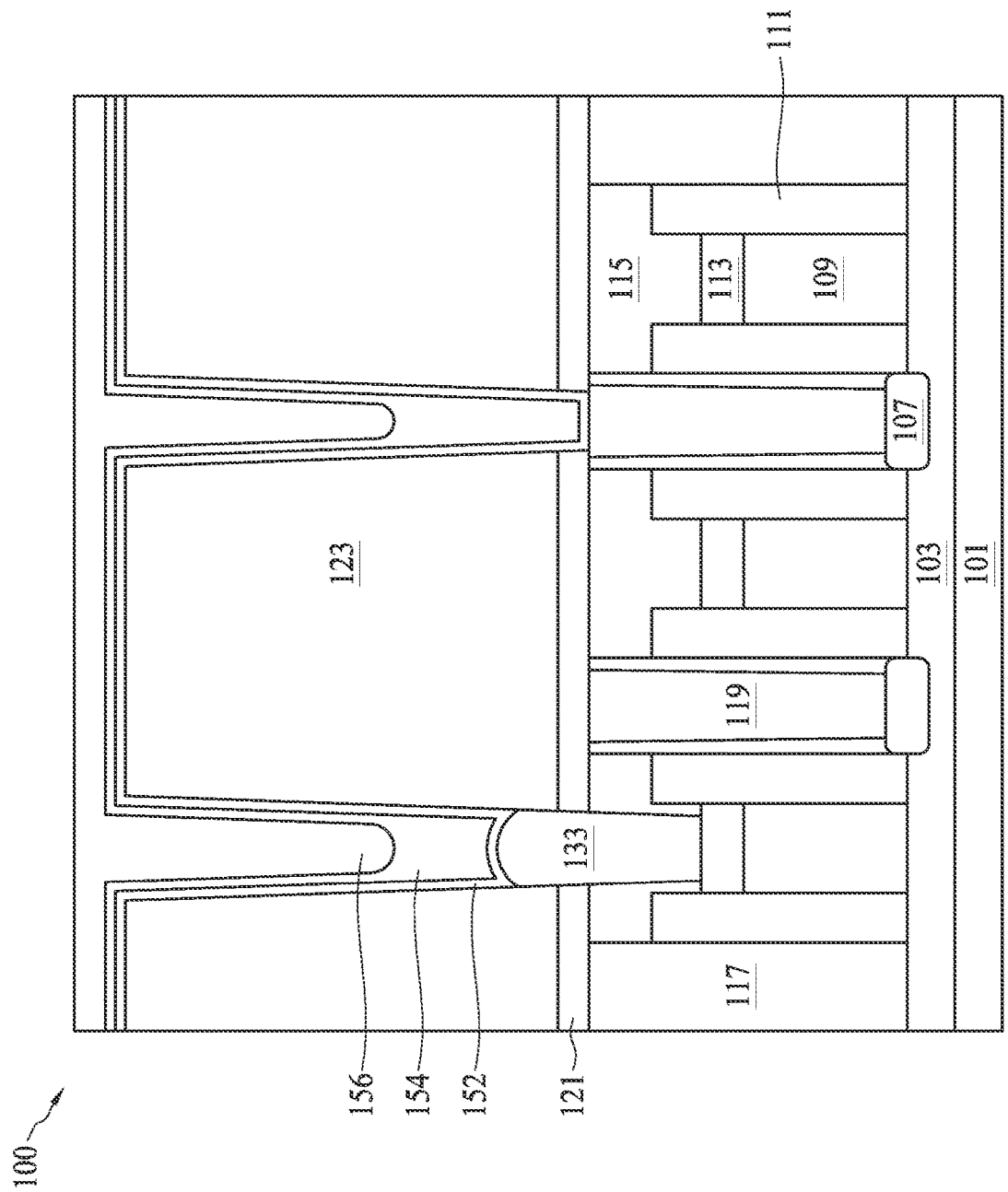

In FIG. 12, a third conductive material 156 is formed over the second conductive material 154 to fill the openings 130 and 147. The third conductive material 156 may comprise one or more of the conductive materials described above for the second conductive material 154 (see above, FIG. 7) and may be formed using similar methods as described above for the second conductive material 154. In some embodiments, the third conductive material 156 is different from the second conductive material 154. In some embodiments, the second conductive material 154 covers bottom surfaces and sidewalls of the third conductive material 156. In some embodiments, the third conductive material 156 is a metal that can alloy with the metal of the second conductive material 154. For example, in some embodiments wherein the second conductive material 154 is ruthenium, the third conductive material 156 is copper or cobalt. In some embodiments wherein the second conductive material 154 is molybdenum, the third conductive material 156 is tungsten. In some embodiments, intermixing between the second conductive material 154 and the third conductive material 156 forms an alloy, and the alloy may be in contact with the first conductive material 133.

Figure 13A:
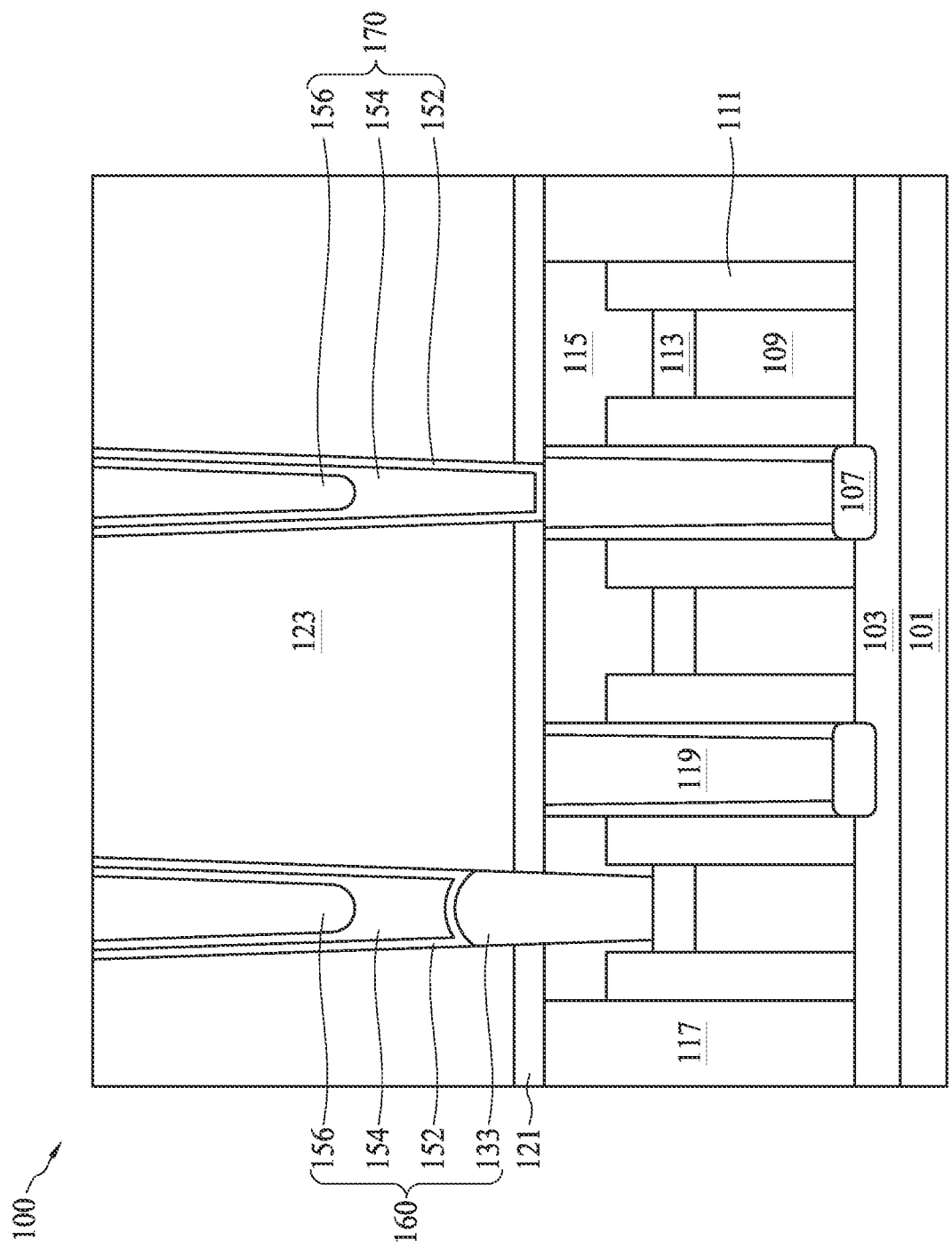

In FIG. 13A, the glue layer 152, the second conductive material 154, the third conductive material 156, and the ILD layer 123 are removed by a planarization, such as a CMP. The resulting gate contact 160 further includes the third conductive material 156, and the resulting conductive via 170 further includes the third conductive material 156. In some embodiments, due to the higher aspect ratio of the gate contact 160 relative to the conductive via 170, the third conductive material is present in top portions of the gate contact 160 but is not present in the conductive via 170.

Figure 13B:
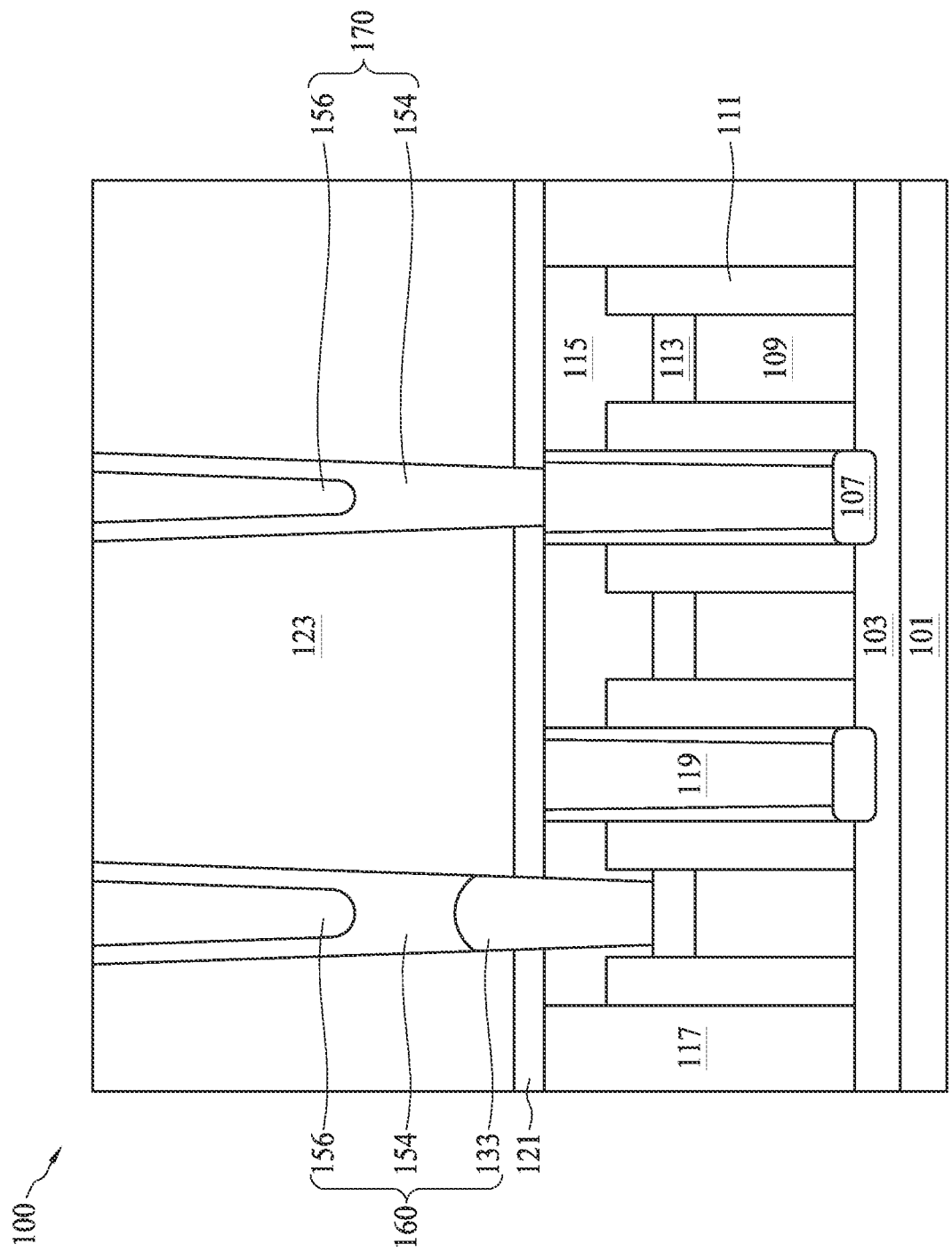
FIG. 13B is a view of a semiconductor device, in accordance with some embodiments.

In another embodiment, the glue layer 152 is omitted and the second conductive material 154 is formed directly on the first conductive material 133 and on the contact plug 119, as illustrated in FIG. 13B. In this embodiment, the gate contact 160 comprises the third conductive material 156 and the second conductive material 154 formed directly on the first conductive material 133, and the conductive via 170 comprises the third conductive material 156 and the second conductive material 154 formed directly on the contact plug 119. The structure illustrated in FIG. 13B may be formed using similar materials and methods as described above with respect to FIG. 13A, with the omission of forming the glue layer 152 (see above, FIG. 7).

FIGS. 14 through 18A are views of intermediate stages in the manufacture of a semiconductor device 100, in accordance with some embodiments. FIGS. 14 through 18A are cross-sectional views illustrated along line A-A' in FIG. 1, except three gate structures 109 are show. The process of FIGS. 14 through 18A follows from the step of FIG. 5 (described above). In this embodiment, a butted contact is formed that is electrically coupled to a gate structure 109 and to a source/drain region 107. In some embodiments, the butted contact is used to form circuitry, e.g. an SRAM cell, in which the contacts to the source/drain region 107 and to the gate structure 109 are at a same voltage.

Figure 14:
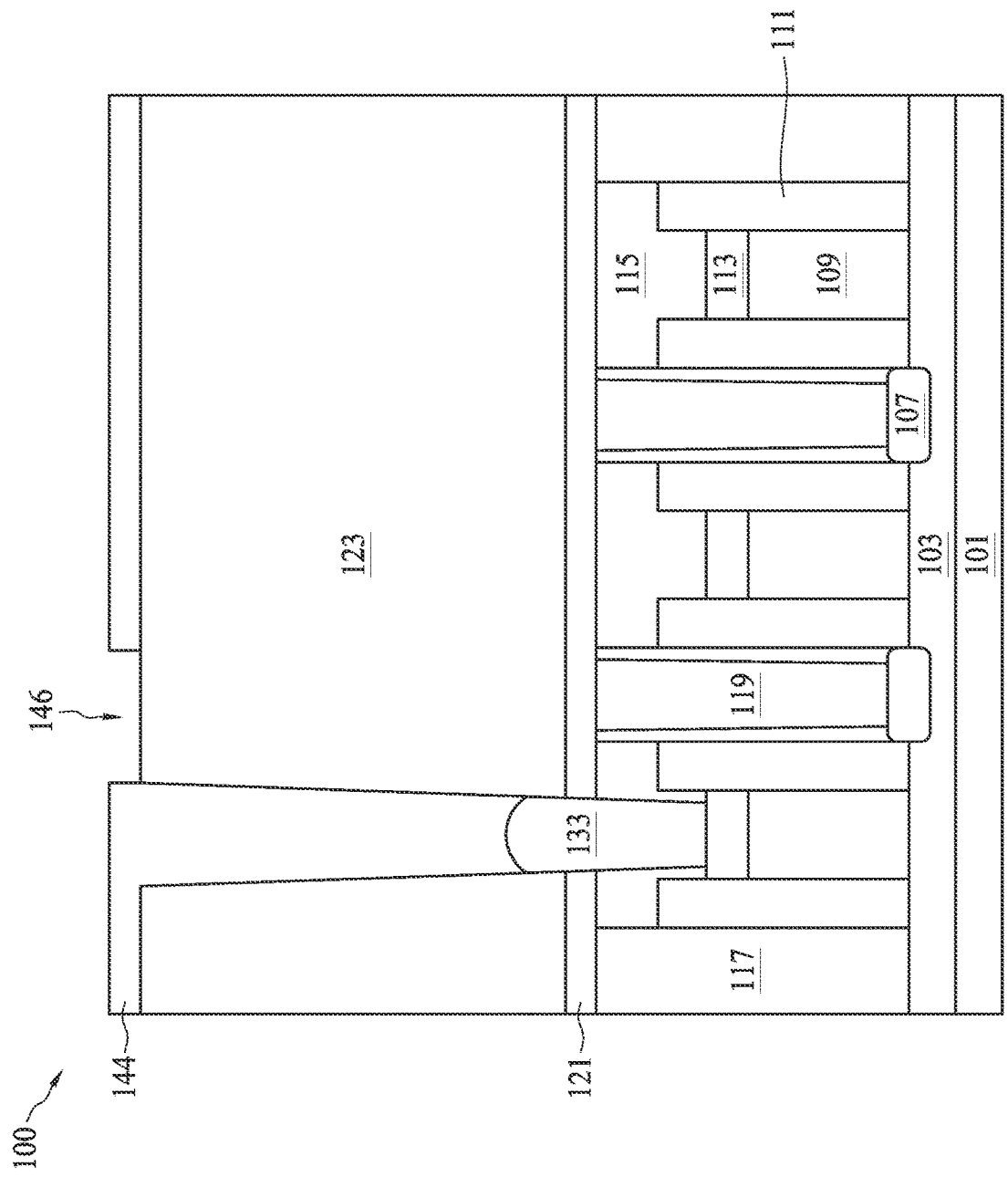

In FIG. 14, a photoresist 144 is formed over the ILD layer 123, filling the opening 130 over the first conductive material 133. The photoresist 144 is patterned to form an opening 146 overlying a contact plug 119 neighboring the first conductive material 133. The photoresist 144 and the opening 146 in the photoresist 144 may be formed using similar methods and materials as described above.

Figure 15:
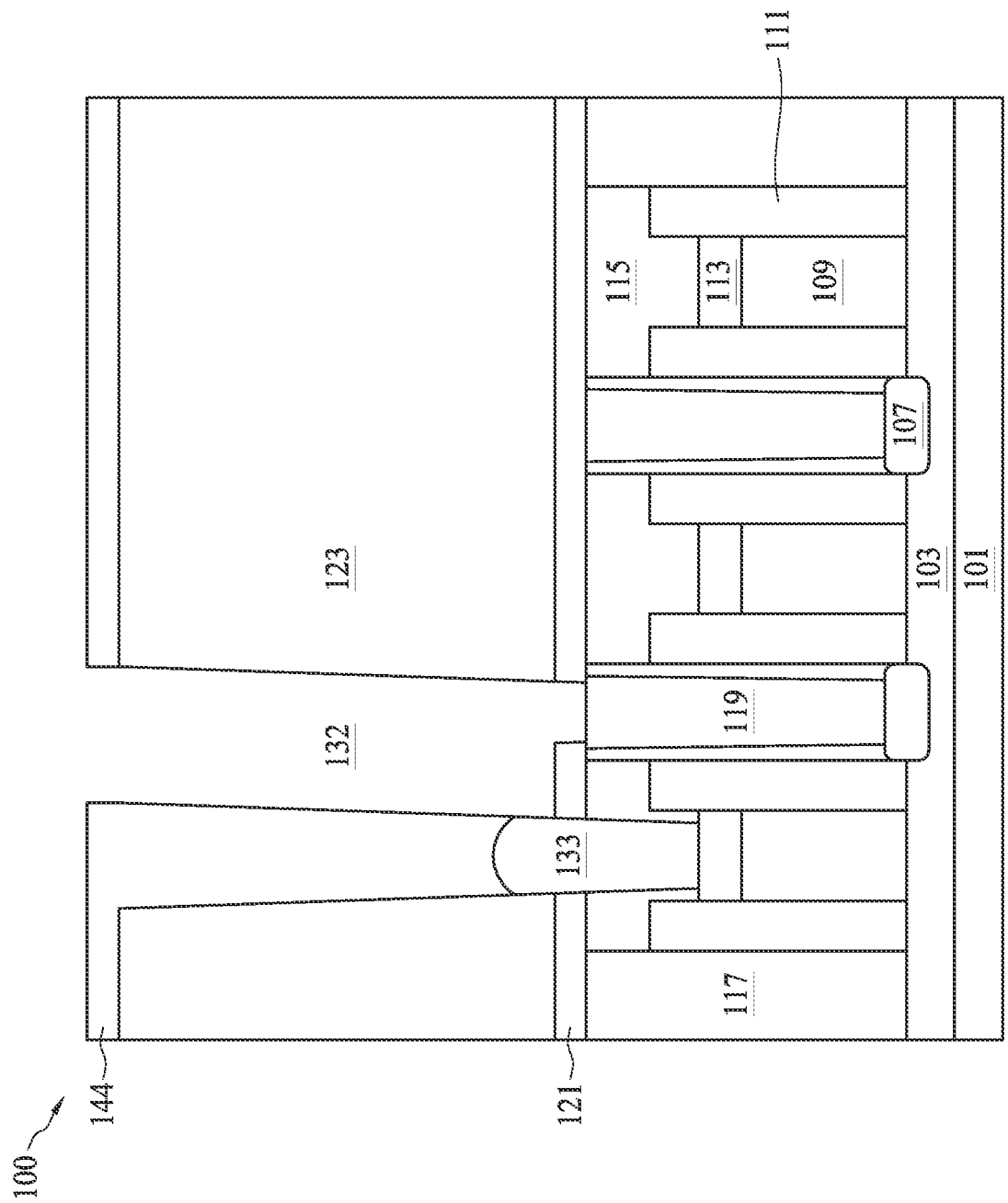

In FIG. 15, the opening 146 is transferred to the ILD layer 123 and the ESL 121, forming an opening 132 that exposes a top surface of the contact plug 119. In some embodiments, the opening 132 extends through the ESL 121 above the contact plug 119, and a portion of the ESL 121 remains at a bottom surface of the opening 132 adjacent to the first conductive material 133. In some embodiments, to transfer the opening 146 of the photoresist 144 to the ILD layer 123 and the ESL 121, one or more anisotropic etching processes, such as one or more anisotropic plasma etching processes, are performed. The one or more anisotropic plasma etching processes may be reactive-ion etching (RIE) processes. The photoresist 144 masks the first conductive material 133 from being etched during the formation of the opening 132.

Figure 16:
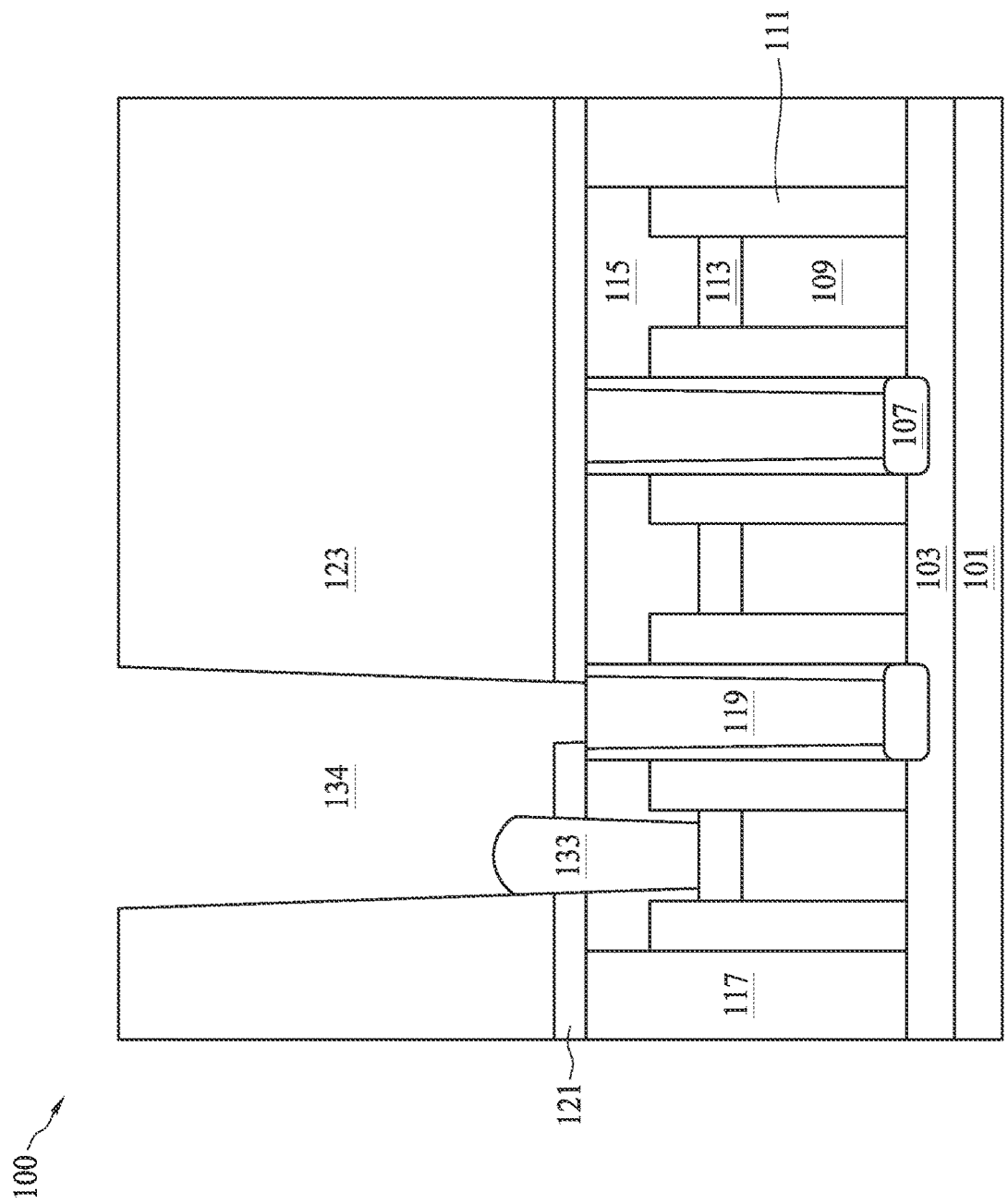

In FIG. 16, the photoresist 144 is removed from the top surface of the ILD layer 123 and from above the first conductive material 133, expanding the openings 130 and 132 to form a wider opening 134 over the gate structure 109 and the contact plug 119. In some embodiments, an ashing process (e.g., a plasma process) is performed to remove the photoresist 144.

Figure 17:
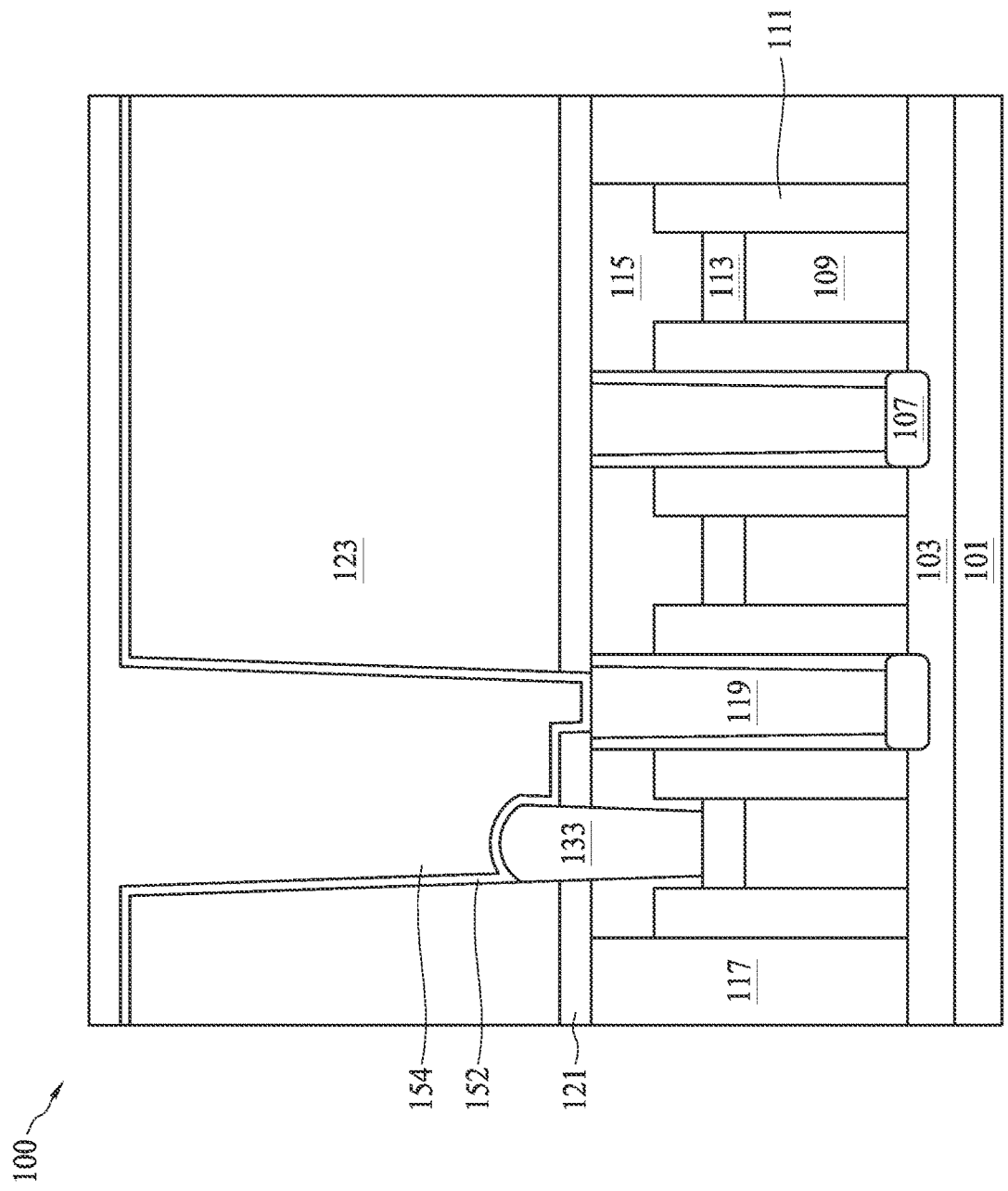

In FIG. 17, a glue layer 152 and a second conductive material 154 are formed in the opening 134 and over a top surface of the ILD layer 123. The portions of the glue layer 152 and the second conductive material 154 in the opening 134 will be used for the subsequent formation of a butted contact (see below, FIG. 18A). The glue layer 152 and the second conductive material 154 may be formed using similar methods and materials as described above with respect to FIG. 7. In some embodiments, the glue layer 152 is a single continuous material physically contacting the first conductive material 133 and the contact plug 119, and the second conductive material 154 is a single continuous material over the first conductive material 133 and the contact plug 119.

Figure 18A:
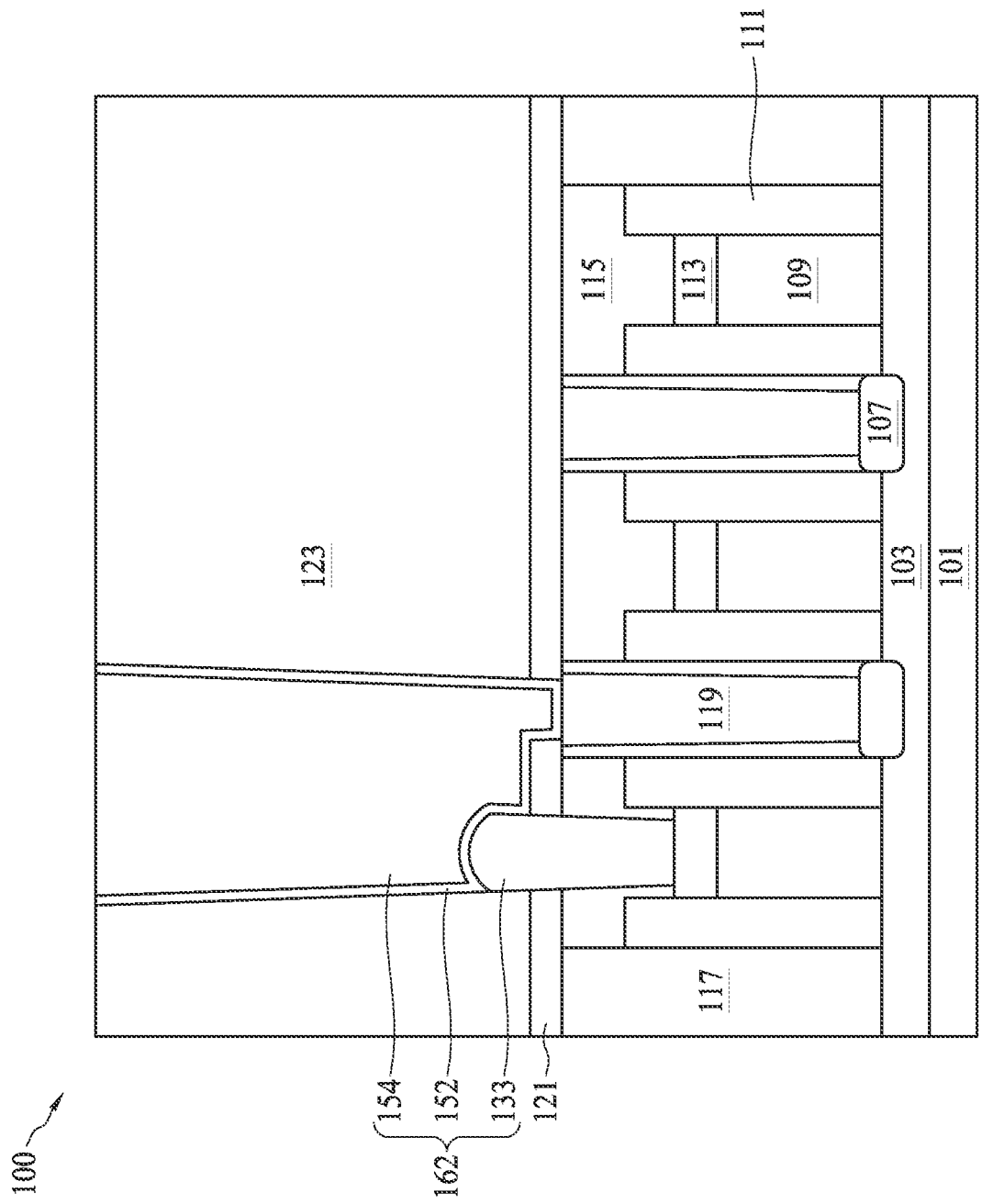

In FIG. 18A, top portions of the glue layer 152, the second conductive material 154, and the ILD layer 123 are removed by a planarization, such as a CMP. A butted contact 162 is formed from remaining portions of the glue layer 152 and the second conductive material 154 together with the first conductive material 133 extending from the capping layer 113. The butted contact 162 may be used to form circuitry, e.g. an SRAM cell, in which the contacts to the source/drain region 107 and to the gate structure 109 are at a same voltage.

Figure 18B:
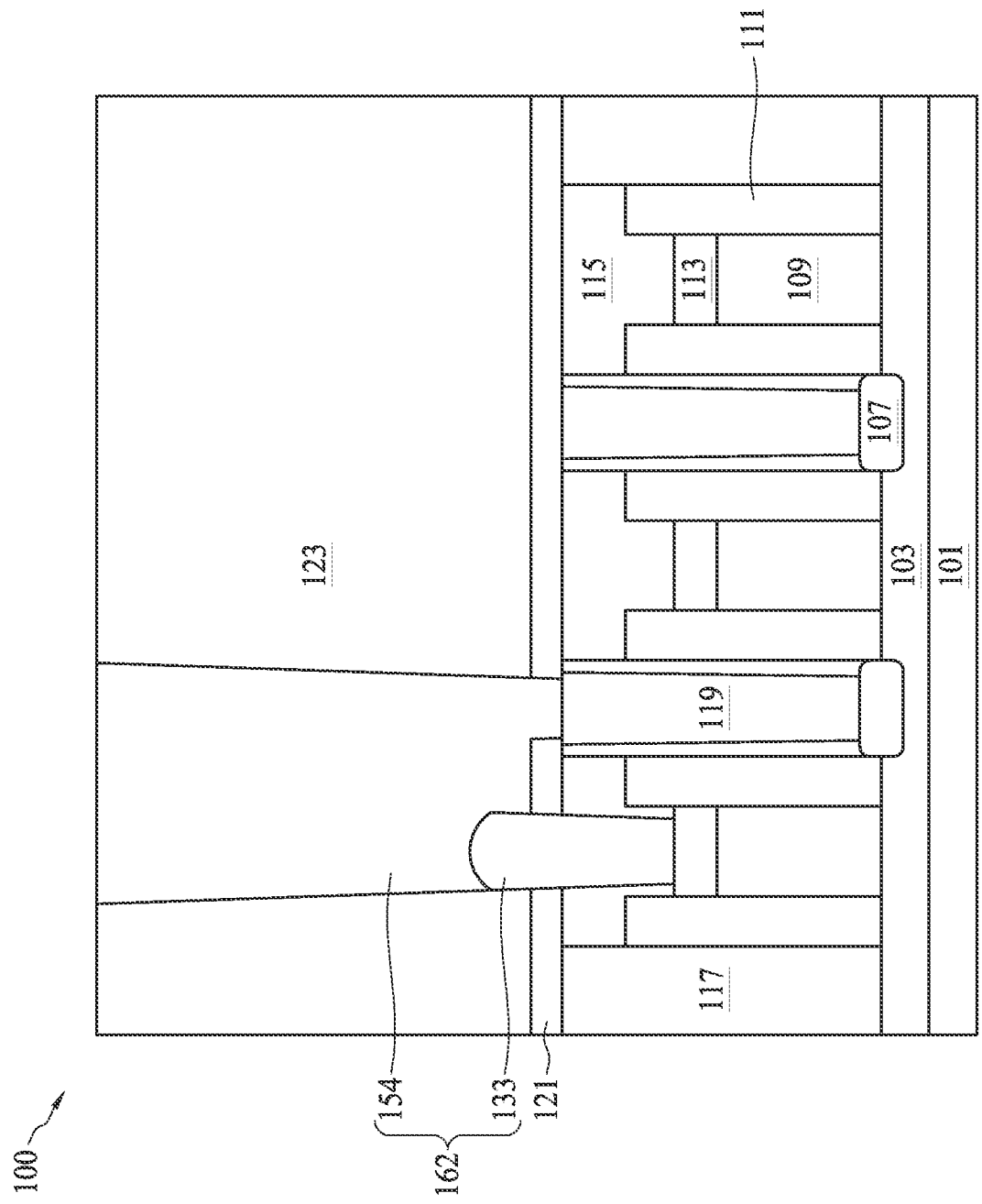
FIGS. 18B, 18C, and 18D are views of semiconductor devices, in accordance with some embodiments.

In another embodiment, the glue layer 152 is omitted and the second conductive material 154 is formed directly on the first conductive material 133 and on the contact plug 119, as illustrated in FIG. 18B. In this embodiment, the butted contact 162 comprises the second conductive material 154 formed directly on the first conductive material 133 and on the contact plug 119. The structure illustrated in FIG. 18B may be formed using similar materials and methods as described with respect to FIG. 18A, with the omission of forming the glue layer 152 (see above, FIG. 7).

Figure 18C:
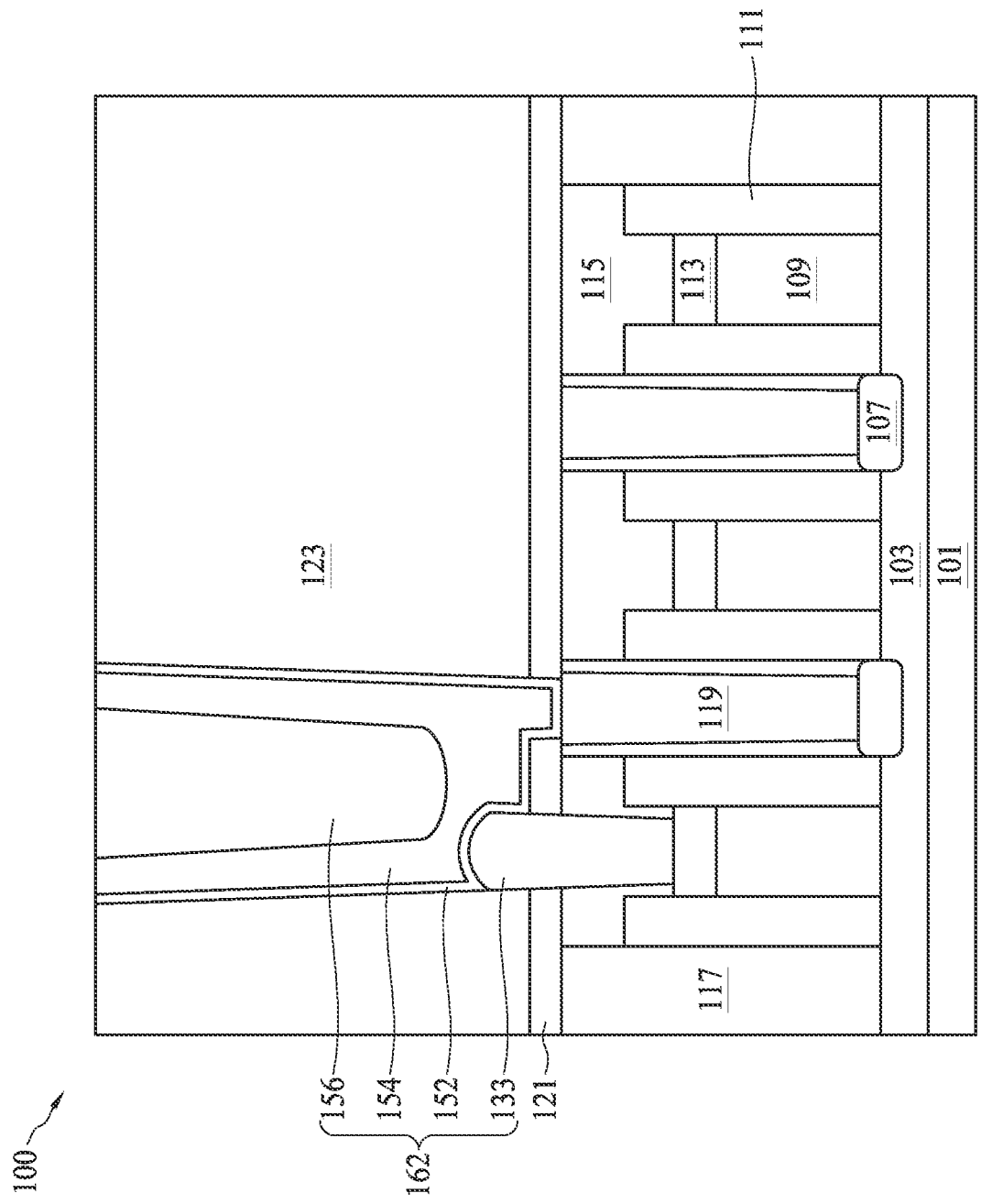

In another embodiment, a butted contact 162 comprises portions of the first conductive material 133, the glue layer 152, the second conductive material 154, and a third conductive material 156, as illustrated in FIG. 18C. The structure illustrated in FIG. 18C may be formed using similar methods and materials as described for the structure illustrated in FIG. 18A with the addition of the formation of the third conductive material 156 as described above with respect to FIGS. 11 through 13A.

Figure 18D:
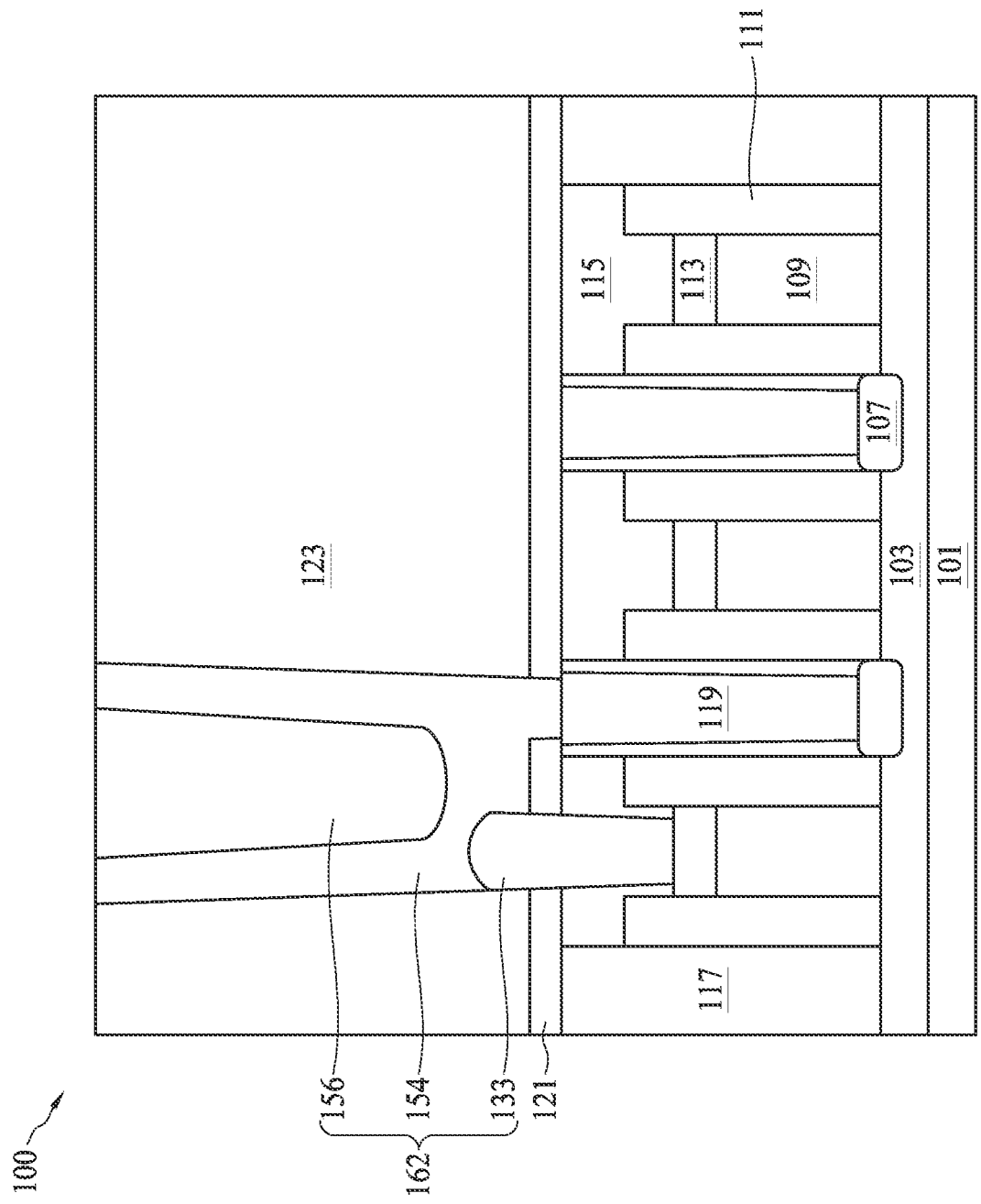

In another embodiment, a butted contact 162 comprises portions of the first conductive material 133, the second conductive material 154, and a third conductive material 156, as illustrated in FIG. 18D. The structure illustrated in FIG. 18D may be formed using similar methods and materials as described for the structure illustrated in FIG. 18B with the addition of the formation of the third conductive material 156 as described above with respect to FIGS. 11, 12, and 13B.

In the embodiments described for FIGS. 14 through 18A, the top surface of the contact plug 119 is free of the first conductive material 133. Some embodiments contemplate other configuration of the butted contact 162. For example, the opening 134 exposing the gate structure 109 and the contact plug 119 may instead be formed after the step described above with respect to FIG. 4, so that the opening 134 extends through the mask layer 115. The first conductive material 133 may then be formed on the gate structure 109 and the contact plug 119.

FIGS. 19 through 21A are views of intermediate stages in the manufacture of a semiconductor device 100, in accordance with some embodiments. FIGS. 19 through 21A are cross-sectional views illustrated along line A-A' in FIG. 1, except three gate structures 109 are shown. The process of FIGS. 19 through 21A follows from the step of FIG. 3 (described above). In this embodiment, the first conductive material 133 is also formed on the contact plug 119, such that the conductive via 170 further includes the first conductive material 133.

In FIG. 19, the openings 130 and 147 are both formed before the formation of the first conductive material 133. In some embodiments, the openings 130 and 147 are formed using similar methods as the opening 130 as described above with respect to FIG. 4. In some embodiments, the openings 130 and 147 are formed with a single patterning process.

Figure 20:
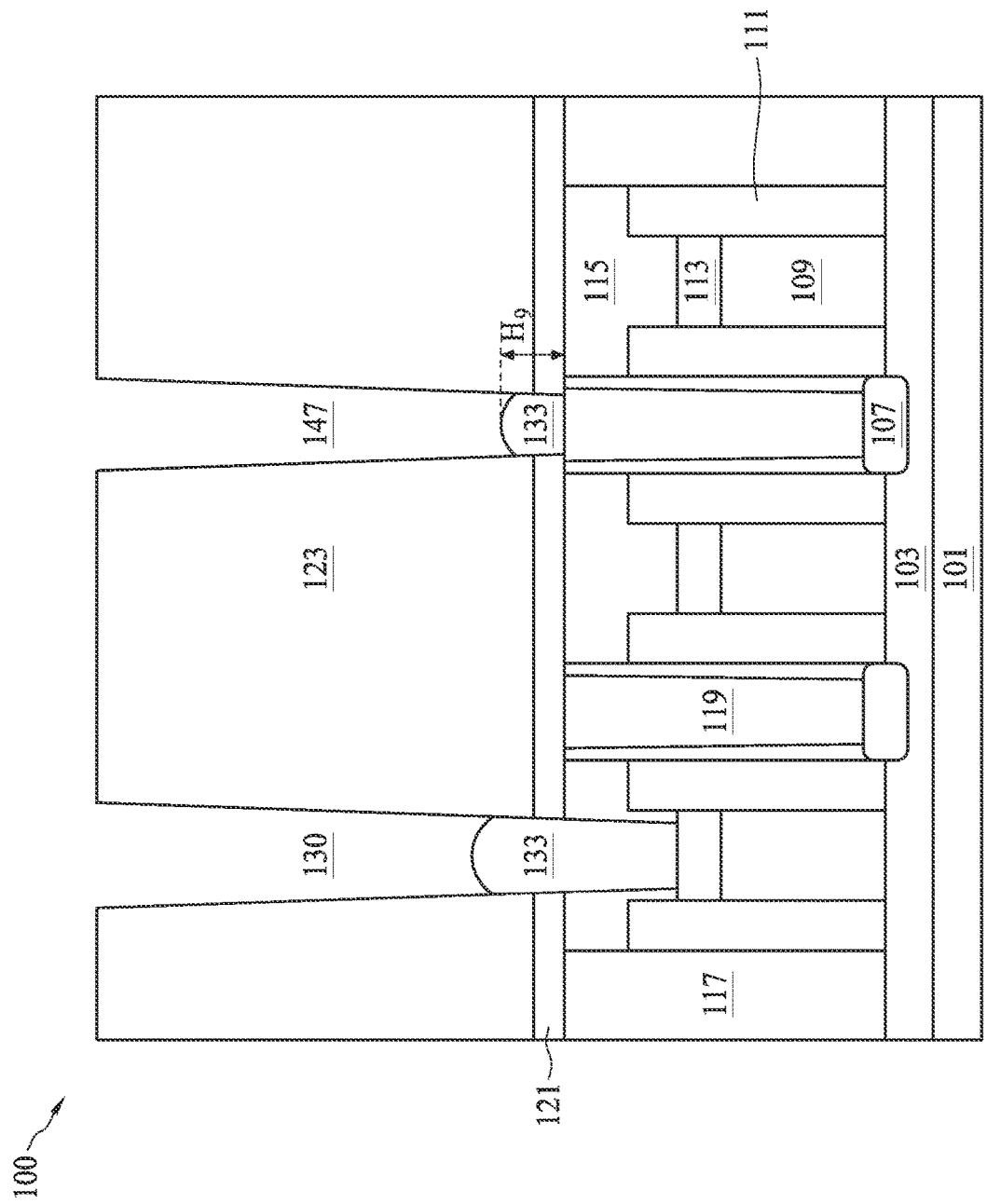

In FIG. 20, the first conductive material 133 is formed at the bottom surfaces of the openings 130 and 147. The first conductive material 133 may be formed using similar materials and methods as described above with respect to FIG. 5. The formation of the first conductive material 133 is selective to conductive materials such as the capping layer 113 and the contact plug 119, and so the first conductive material 133 is formed on exposed surfaces of the capping layer 113 and the contact plug 119. In some embodiments, the first conductive material 133 is formed to a height $H_9$ measured relative to a top surface of the contact plug 119 in a range of 1 nm to 20 nm.

Figure 21A:
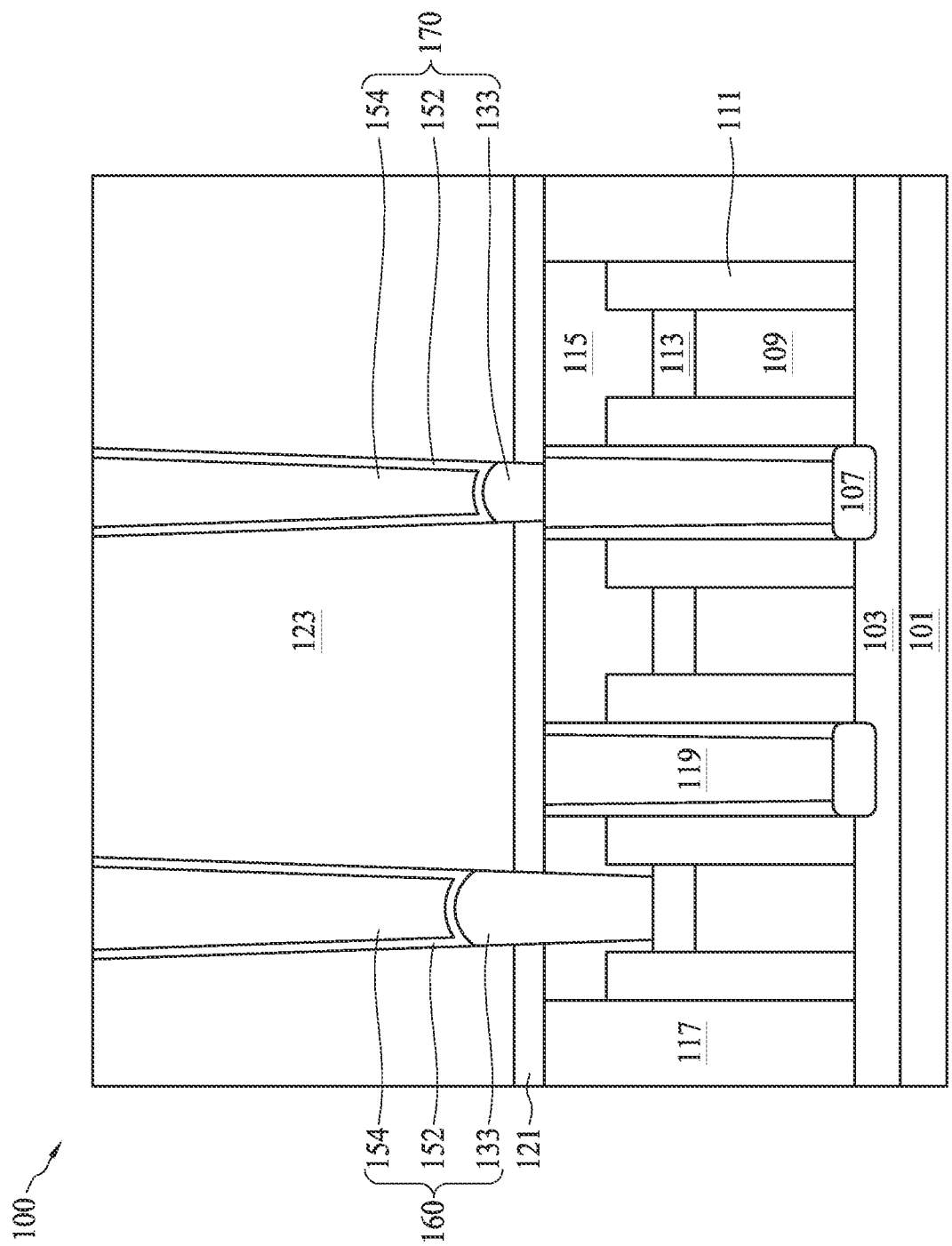

In FIG. 21A, the glue layer 152 and the second conductive material 154 are formed on the first conductive material 133. The portions of the conductive materials extending from the capping layer 113 form the gate contact 160. The portions of the conductive materials extending from the contact plug 119 form the conductive via 170. The structure illustrated in FIG. 21A may be formed from the structure illustrated in FIG. 20 using similar process steps as described above with respect to FIGS. 7 and 8A.

Figure 21B:
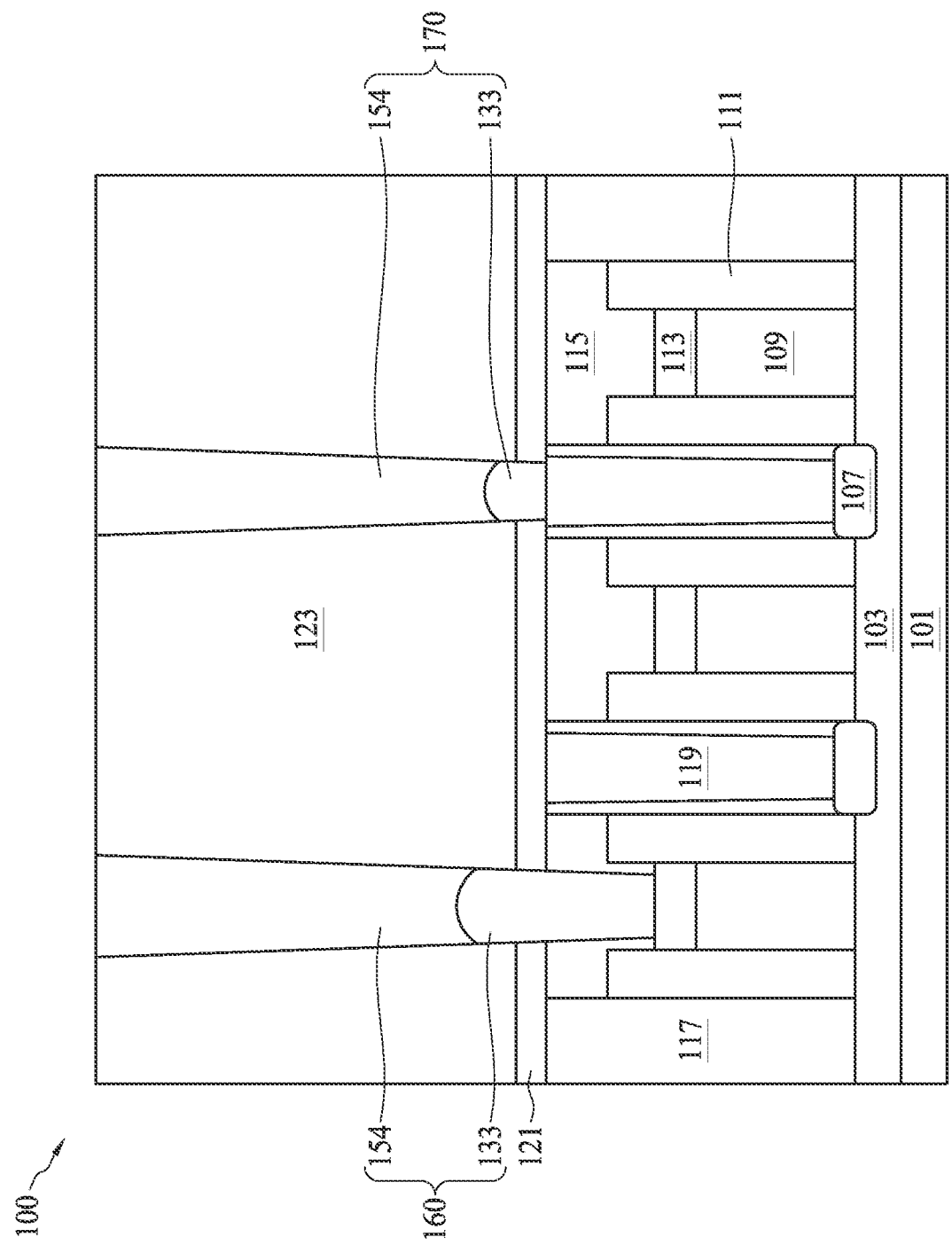
FIGS. 21B, 21C, and 21D are views of semiconductor devices, in accordance with some embodiments.

In another embodiment, the glue layer 152 is omitted and the second conductive material 154 is formed directly on the first conductive material 133, as illustrated in FIG. 21B. In this embodiment, the gate contact 160 comprises the second conductive material 154 formed directly on the first conductive material 133, and the conductive via 170 comprises the second conductive material 154 formed directly on first conductive material 133. The structure illustrated in FIG. 21B may be formed from the structure illustrated in FIG. 20 using similar process steps as described above with respect to FIGS. 7 and 8B.

Figure 21C:
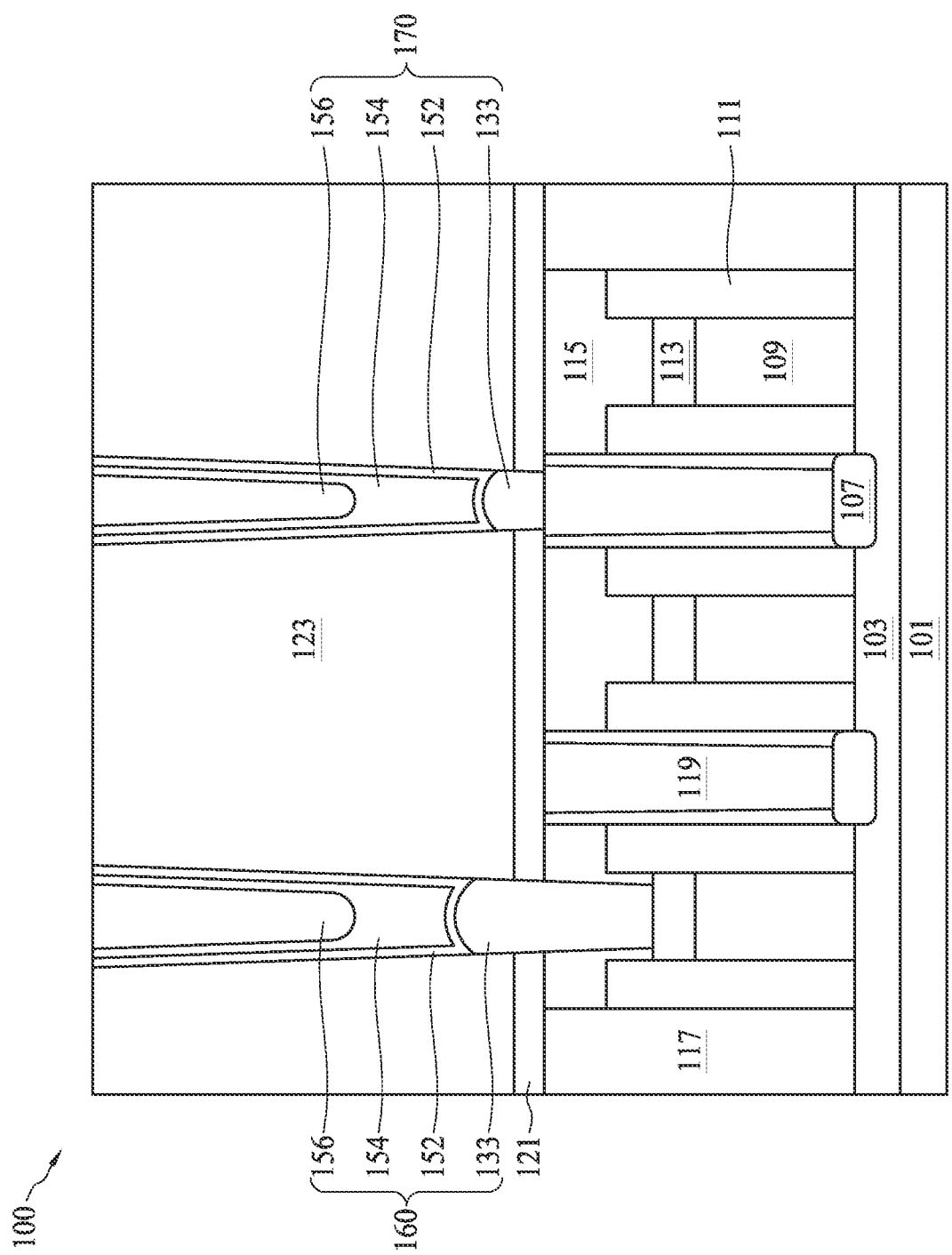

In another embodiment, the gate contact 160 and the conductive via 170 comprise portions of the first conductive material 133, the glue layer 152, the second conductive material 154, and a third conductive material 156, as illustrated in FIG. 21C. The structure illustrated in FIG. 21C may be formed from the structure illustrated in FIG. 20 using similar process steps as described above with respect to FIGS. 11-13A.

Figure 21D:
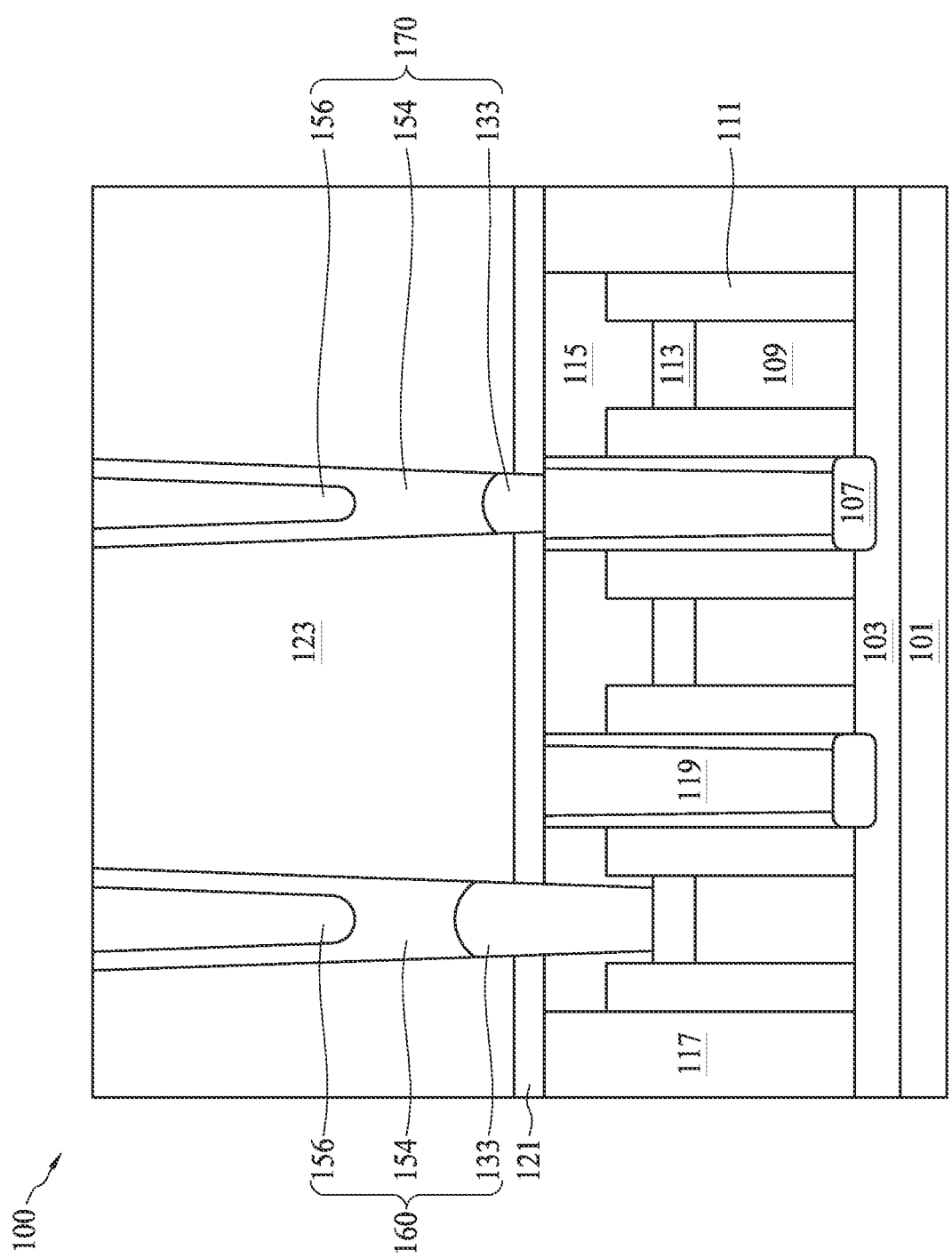

In another embodiment, the gate contact 160 and the conductive via 170 comprise portions of the first conductive material 133, the second conductive material 154, and a third conductive material 156, as illustrated in FIG. 21D. The structure illustrated in FIG. 21D may be formed from the structure illustrated in FIG. 20 using similar process steps as described above with respect to FIGS. 11, 12, and 13B.

Embodiments may provide advantages. The aspect ratio of the openings (e.g., contact openings or via openings) may be reduced prior to filling the openings with a conductive fill material by selectively forming a conductive material at the bottom surfaces of the openings. Reducing the aspect ratio of the openings with the selective formation of the conductive material may alleviate the difficulty of gap-filling in the openings and reduce the formation of defects such as voids in subsequent filling processes to form conductive contacts in the openings. This may reduce the contact resistance and improve performance of the resulting device.

In accordance with an embodiment, a semiconductor device includes: a gate structure on a semiconductor fin; a dielectric layer on the gate structure; and a gate contact extending through the dielectric layer to the gate structure, the gate contact including: a first conductive material on the gate structure, a top surface of the first conductive material extending between sidewalls of the dielectric layer; and a second conductive material on the top surface of the first conductive material, the second conductive material being different from the first conductive material. In an embodiment, the top surface of the first conductive material is a convex top surface. In an embodiment, the gate contact further includes: a glue layer, a sidewall portion of the glue layer being between the sidewalls of the dielectric layer and the second conductive material, a bottom portion of the glue layer being between the top surface of the first conductive material and the second conductive material. In an embodiment, the gate contact further includes a third conductive material on the second conductive material, the third conductive material being different from the second conductive material. In an embodiment, the second conductive material and the third conductive material are intermixed in an alloy. In an embodiment, the alloy contacts the first conductive material. In an embodiment, the second conductive material physically contacts the top surface of the first conductive material. In an embodiment, the semiconductor device further includes: a source/drain region in the semiconductor fin; a contact plug on the source/drain region; and a conductive via on the contact plug, the conductive via being surrounded by the dielectric layer. In an embodiment, the conductive via has a rivet-shaped bottom portion, the rivet-shaped bottom portion being below a top surface of the contact plug.

In accordance with another embodiment, a semiconductor device includes: a semiconductor substrate; a gate structure on the semiconductor substrate; a source/drain region on the semiconductor substrate; a contact plug on the source/drain region; a first conductive material on the gate structure; and a second conductive material on the first conductive material and on the contact plug, the second conductive material being different from the first conductive material. In an embodiment, the semiconductor device further includes a capping layer on the gate structure. In an embodiment, the semiconductor device further includes a glue layer. In an embodiment, the semiconductor device further includes a third conductive material on the second conductive material, the third conductive material being different from the second conductive material, the second conductive material covering a sidewall and a bottom surface of the third conductive material.

In accordance with yet another embodiment, a method includes: forming a first opening through a dielectric layer, the first opening exposing a sidewall of the dielectric layer and a top surface of a gate structure, the gate structure disposed on a substrate; forming a first conductive material in the first opening, wherein the first conductive material is selectively formed at a faster rate on the top surface of the gate structure than on the sidewall of the dielectric layer; and forming a second conductive material on the first conductive material in the first opening, the second conductive material being different from the first conductive material. In an embodiment, forming the first conductive material includes depositing tungsten on the top surface of the gate structure with a selective CVD process. In an embodiment, the selective CVD process is performed using $WF_x$ or $WCl_x$ as a precursor. In an embodiment, forming the first conductive material includes plating cobalt from the top surface of the gate structure with an electroless plating process. In an embodiment, the electroless plating process is performed using a plating solution including $CoCl_x$ or $CoS_xO_y$, the plating solution having a pH in a range of 6.0 to 9.0. In an embodiment, forming the first conductive material includes plating copper from the top surface of the gate structure with an electroless plating process. In an embodiment, the electroless plating process is performed using a plating solution including $CuCl_x$ or $CuS_xO_y$, the plating solution having a pH in a range of 7.0 to 10.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure on a semiconductor fin;
   a dielectric layer on the gate structure; and
   a gate contact extending through the dielectric layer to the gate structure, the gate contact comprising:
      a first conductive material on the gate structure, a top surface of the first conductive material extending between sidewalls of the dielectric layer, the top surface of the first conductive material being above a bottom surface of the dielectric layer and below a top surface of the dielectric layer;
      a second conductive material on the top surface of the first conductive material, the second conductive material being different from the first conductive material; and
      a glue layer, a sidewall portion of the glue layer being between the sidewalls of the dielectric layer and the second conductive material, a bottom portion of the glue layer being between the top surface of the first conductive material and the second conductive material.

2. The semiconductor device of claim 1, wherein the top surface of the first conductive material is a convex top surface.

3. The semiconductor device of claim 1, wherein the gate contact further comprises a third conductive material on the second conductive material, the third conductive material being different from the second conductive material.

4. The semiconductor device of claim 3, wherein the second conductive material and the third conductive material are intermixed in an alloy.

5. The semiconductor device of claim 4, wherein the alloy contacts the first conductive material.

6. The semiconductor device of claim 1, wherein the second conductive material physically contacts the top surface of the first conductive material.

7. The semiconductor device of claim 1, further comprising:
   a source/drain region in the semiconductor fin;
   a contact plug on the source/drain region; and
   a conductive via on the contact plug, the conductive via being surrounded by the dielectric layer, wherein the conductive via has a rivet-shaped bottom portion, the rivet-shaped bottom portion being below a top surface of the contact plug.

8. The semiconductor device of claim 1, wherein sidewalls of the first conductive material are in contact with the sidewalls of the dielectric layer.

9. A semiconductor device, comprising:
   a semiconductor substrate;
   a gate structure on the semiconductor substrate;
   a source/drain region on the semiconductor substrate;
   a dielectric layer over the gate structure and the source/drain region;
   a contact plug on the source/drain region;
   a first conductive material on and in contact with the gate structure, a top surface of the first conductive material intersecting sidewalls of the dielectric layer, and sidewalls of the first conductive material being in contact with the sidewalls of the dielectric layer; and
   a second conductive material on the first conductive material and on the contact plug, the second conductive material being different from the first conductive material.

10. The semiconductor device of claim 9, further comprising a capping layer on the gate structure.

11. The semiconductor device of claim 9, further comprising a glue layer covering sidewalls and bottom surfaces of the second conductive material.

12. The semiconductor device of claim 9, further comprising a third conductive material on the second conductive material, the third conductive material being different from the second conductive material, the second conductive material covering a sidewall and a bottom surface of the third conductive material.

13. A method comprising:
   forming a first opening through a dielectric layer, the first opening exposing a sidewall of the dielectric layer and a top surface of a gate structure, the gate structure disposed on a substrate;
   forming a first conductive material in the first opening, wherein the first conductive material is selectively formed at a faster rate on the top surface of the gate structure than on the sidewall of the dielectric layer; and
   forming a second conductive material on the first conductive material in the first opening, the second conductive material being different from the first conductive material.

14. The method of claim 13, wherein forming the first conductive material comprises depositing tungsten on the top surface of the gate structure with a selective CVD process.

15. The method of claim 14, wherein the selective CVD process is performed using $WF_x$ or $WCl_x$ as a precursor.

16. The method of claim 13, wherein forming the first conductive material comprises plating cobalt from the top surface of the gate structure with an electroless plating process.

17. The method of claim 16, wherein the electroless plating process is performed using a plating solution comprising $CoCl_x$ or $CoS_xO_y$, the plating solution having a pH in a range of 6.0 to 9.0.

18. The method of claim 13, wherein forming the first conductive material comprises plating copper from the top surface of the gate structure with an electroless plating process.

19. The method of claim 18, wherein the electroless plating process is performed using a plating solution comprising $CuCl_x$ or $CuS_xO_y$, the plating solution having a pH in a range of 7.0 to 10.0.

20. The method of claim 13, wherein a top surface of the first conductive material is above a bottom surface of the dielectric layer and below a top surface of the dielectric layer, and a sidewall of the first conductive material is in contact with the sidewall of the dielectric layer.

* * * * *